US 8,174,888 B2

(12) United States Patent
Lee et al.

(10) Patent No.: US 8,174,888 B2
(45) Date of Patent: May 8, 2012

(54) PAGE-BUFFER AND NON-VOLATILE SEMICONDUCTOR MEMORY INCLUDING PAGE BUFFER

(75) Inventors: Sung-Soo Lee, Sungnam-si (KR); Young-Ho Lim, Yongin-si (KR); Hyun-Chul Cho, Yongin-si (KR); Dong-Hyuk Chae, Seoul (KR)

(73) Assignee: Samsung Electronics Co., Ltd., Suwon-Si, Gyeonggi-Do (KR)

( * ) Notice: Subject to any disclaimer, the term of this patent is extended or adjusted under 35 U.S.C. 154(b) by 0 days.

(21) Appl. No.: 12/752,213

(22) Filed: Apr. 1, 2010

(65) Prior Publication Data

US 2010/0202204 A1    Aug. 12, 2010

Related U.S. Application Data

(62) Division of application No. 12/035,028, filed on Feb. 21, 2008, now Pat. No. 7,724,575, and a division of application No. 11/228,189, filed on Sep. 19, 2005, now Pat. No. 7,379,333.

(30) Foreign Application Priority Data

Oct. 28, 2004  (KR) ................................. 2004-86450
Oct. 28, 2004  (KR) ................................. 2004-86451

(51) Int. Cl.
*G11C 11/34* (2006.01)
(52) U.S. Cl. .......... 365/185.12; 365/185.17; 365/189.05
(58) Field of Classification Search ............. 365/185.12, 365/189.04, 189.05, 185.17
See application file for complete search history.

(56) References Cited

U.S. PATENT DOCUMENTS 5,544,101 A     8/1996  Houston
5,625,590 A *   4/1997  Choi et al. ............... 365/185.17
5,671,178 A     9/1997  Park
(Continued)

FOREIGN PATENT DOCUMENTS

JP      08-255496       10/1996
(Continued)

OTHER PUBLICATIONS

Office Action From Japanese Patent Office Dated April 26, 2011 Corresponding to Japanese Patent Application No. 2005-315094.

(Continued)

*Primary Examiner* — Alexander Sofocleous
(74) *Attorney, Agent, or Firm* — Volentine & Whitt, PLLC

(57) ABSTRACT

In one aspect, a non-volatile memory device is provided which is operable in a programming mode and a read mode. The memory device includes a memory cell array which includes a plurality of non-volatile memory cells, a plurality of word lines, and a plurality of bit lines. The memory device further includes an internal data output line for outputting data read from the bit lines of the memory array, and a page buffer operatively connected between a bit line of the memory cell array and the internal data output line. The page buffer includes a sense node which is selectively connected to the bit line, a latch circuit having a latch node which is selectively connected to the sense node, a latch input path which sets a logic voltage of the latch node in the programming mode and the read mode, and a latch output path which is separate from the latch input path and which sets as logic voltage of the internal date output line according to the logic voltage of the latch node.

15 Claims, 21 Drawing Sheets

U.S. PATENT DOCUMENTS

| | | | | |
|---|---|---|---|---|
| 5,748,529 | A * | 5/1998 | Lee | 365/185.17 |
| 5,825,691 | A * | 10/1998 | McClure | 365/189.16 |
| 5,886,924 | A * | 3/1999 | Kim et al. | 365/185.11 |
| 5,936,890 | A | 8/1999 | Yeom | |
| 5,996,041 | A * | 11/1999 | Kim | 711/103 |
| 6,144,584 | A * | 11/2000 | Kunori et al. | 365/185.18 |
| 6,278,636 | B1 | 8/2001 | Lee | |
| 6,335,881 | B2 * | 1/2002 | Kim et al. | 365/185.18 |
| 6,480,419 | B2 | 11/2002 | Lee | |
| 6,671,204 | B2 * | 12/2003 | Im | 365/185.12 |
| 6,717,857 | B2 * | 4/2004 | Byeon et al. | 365/185.21 |
| 6,768,682 | B2 * | 7/2004 | Yano et al. | 365/185.28 |
| 6,891,754 | B2 | 5/2005 | Jeong | |
| 6,996,014 | B2 | 2/2006 | Lee | |
| 7,224,624 | B2 * | 5/2007 | Lee et al. | 365/189.05 |
| 2003/0072175 | A1 | 4/2003 | Kawamura | |
| 2003/0210576 | A1 | 11/2003 | Hwang | |
| 2004/0109342 | A1 * | 6/2004 | Fujino | 365/149 |
| 2006/0152976 | A1 | 7/2006 | Lee | |
| 2007/0028155 | A1 | 2/2007 | Kim | |

FOREIGN PATENT DOCUMENTS

| | | |
|---|---|---|
| JP | 09-180477 | 7/1997 |
| JP | 09-204788 | 8/1997 |
| JP | 09-231770 | 9/1997 |
| JP | 10-144892 | 5/1998 |
| JP | 11-144482 | 5/1999 |
| JP | 11-330426 | 11/1999 |
| JP | 2001-229684 | 8/2001 |
| JP | 2003-141882 | 5/2003 |
| JP | 2003-173688 | 6/2003 |
| JP | 2004-186501 | 7/2004 |
| JP | 2004-192780 | 7/2004 |
| KR | 1020030033679 A | 5/2003 |

OTHER PUBLICATIONS

German Office Action Dated Jan. 26, 2012 in Related German Application No. 10 2005 052 696.9.

* cited by examiner

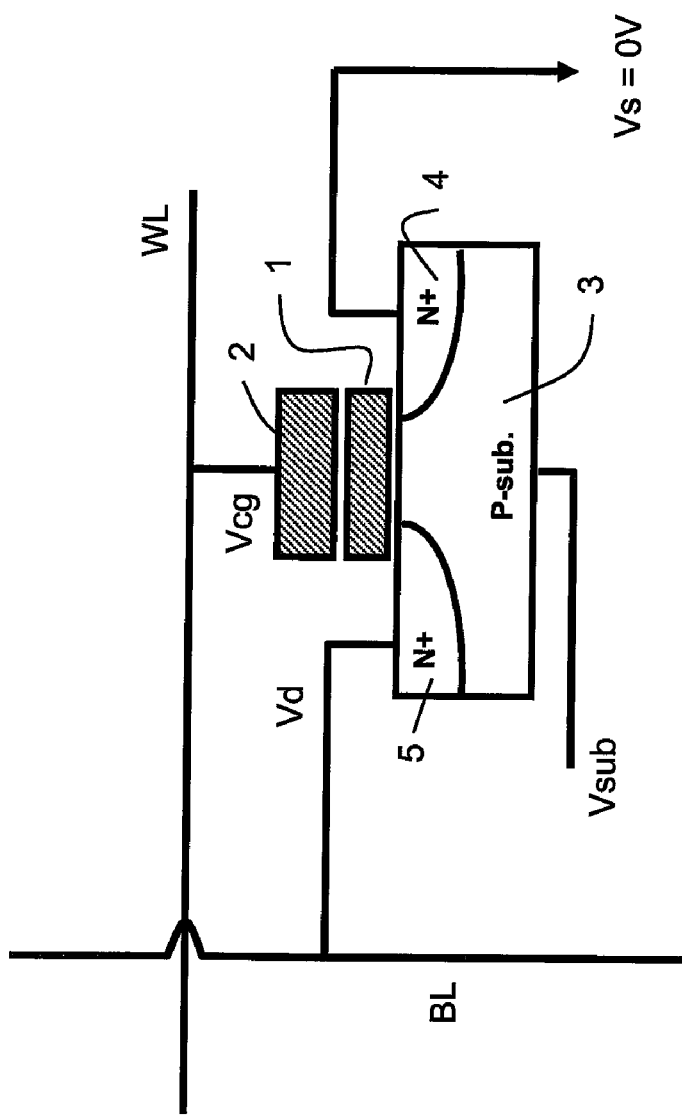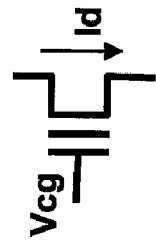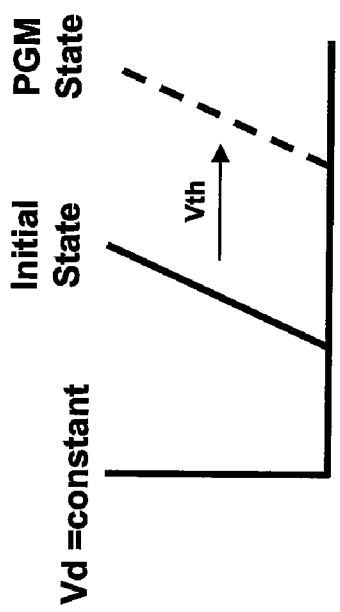
FIG. 1A (Prior Art)
FIG. 1B (Prior Art)
FIG. 1C (Prior Art)

PAGE-BUFFER AND NON-VOLATILE SEMICONDUCTOR MEMORY INCLUDING PAGE BUFFER

CROSS-REFERENCE TO RELATED APPLICATIONS

This is a Divisional application of application Ser. No. 12/035,028, filed Feb. 21, 2008, which is a Divisional application of application Ser. No. 11/228,189, filed Sep. 19, 2005, which is incorporated herein by reference in its entirety.

BACKGROUND OF THE INVENTION

1. Field of the Invention

The present invention generally relates to semiconductor memory devices, and more particularly, the present invention relates to page buffer circuits and other circuits utilized in non-volatile semiconductor memory devices.

2. Description of the Related Art

The demand for electrically programmable and electrically erasable nonvolatile memory devices has increased dramatically in recent years. Such devices are at least partially characterized by the ability to maintain stored data even in the absence of supplied power. The use of so-called flash memories has become especially popular, particularly, but not exclusively, in the context of portable devices such as digital cameras, cell phones, personal data assistants (PDAs), and laptop computers. Flash memories, such as NAND-type flash memories, are capable of storing large amounts of data in a relatively small area.

As background discussion, the basic operating principles underlying flash memory cells and flash memory devices are presented below. However, it should be clearly understood that the discussion that follows is merely exemplary and does not in any way limit and/or define the scope of the present invention.

The operating principle of a flash memory cell will be described first with reference to FIGS. 1A through 1C. FIG. 1A illustrates a typical configuration in which a flash memory cell transistor is connected to word and bit lines of a memory device, FIG. 1B shows the circuit symbol of a flash memory cell transistor, and FIG. 1C shows the threshold voltage characteristics of a flash memory cell transistor.

Referring collectively to FIGS. 1A through 1C, a flash memory cell transistor includes a source region 4 and a drain region 5 located at the surface of a substrate 3. In this example, the substrate is P-type, and the source and drain regions 4 and 5 are N$^+$-type. A gate structure is aligned over a channel region defined between the source and drain regions 4 and 5. The gate structure includes a floating gate 1 and a control gate 2. Although not shown, a tunneling dielectric layer is interposed between the floating gate 1 and surface of the substrate Psub, and another thin oxide layer (or control dielectric) is interposed between the floating gate 1 and the control gate 2. In the illustrated example, the drain voltage Vd is supplied from a bit line BL, the control gate voltage Vcg is supplied from a word line WL, and the source voltage Vs is connected to a reference potential such as ground.

The threshold voltage of the flash memory cell transistor defines its stored logic value. That is, when the flash memory cell transistor is in its initial state (also called an "erased" state), the threshold voltage Vth is relatively low as shown in FIG. 1C. In this state, the cell transistor is designated to have a logic value "1", which generally corresponds to the ON state of a conventional transistor device. On the other hand, when the cell transistor is in its "programmed" state (PGM), the threshold voltage Vth is relatively high. This high threshold state is designated to have a logic value "0", which generally corresponds to the OFF state of a conventional transistor device.

In order to change (program) the cell transistor from its initial state to its programmed state, a process known as Fowler-Nordheim (FN) tunneling is utilized. Briefly, a relatively large positive potential difference is created between the control gate 2 and the substrate Psub, and excited electrons within the channel on the surface of the substrate Psub are caused to be pushed through and trapped in the floating gate 1. These negatively charged electrons act as a barrier between the control gate 2 and the channel on the substrate Psub, thus increasing the threshold voltage of the cell transistor as represented in FIG. 1C. The cell transistor can be brought back to its initial state by forming a large negative potential difference between the control gate 2 and the substrate Psub, whereby resultant FN tunneling draws the trapped electrons back across the thin oxide layer between the floating gate 1 and substrate Psub, thus removing the electron barrier and decreasing the threshold voltage Vth.

Turning now to FIG. 2, the ON and OFF threshold voltages Vth of the large numbers of flash cell transistors found in flash memory devices generally exhibit bell curve distributions. For example, the threshold voltages Vth of the erased cell transistors (having logic value "1") may be distributed between −3 v and −1 v, whereas the threshold voltages Vth of the programmed cell transistors (having logic value "0") may be distributed between +1 v and +3 v.

Referring now to FIG. 3A, NAND flash memories are characterized by serially connected "strings" 6 of flash memory cell transistors, where multiple parallel strings 6 constitute a memory block 7 of the flash memory. As shown, each string 6 is comprised of a plurality of flash memory cell transistors connected in series along a bit line B/L in the memory block 7. Word lines W/L are connected to the control gates of each respective row of cell transistors in the memory block 7. For example, a flash memory device may contain 16 or 32 cell transistors in each string 6, and 4224 strings (B/L0 . . . B/L4223) in each memory block 7.

At opposite ends of each string 6 are string select transistors having control gates which receive a string select signals SSL and a ground select signal GSL. Generally, the select signals SSL and GSL are utilized in reading and programming of the cell transistors. Further, at the end of each string is a common source line CSL which sets a source line voltage of the cell transistor strings 6 of each memory block 7.

The table of FIG. 3B generally shows the various voltage conditions of the signals illustrated in FIG. 3A for each of erase, program and read operations. In this table, "Sel. W/L" denotes the selected word line for which the program or read operation is to be executed, and "Unsel.W/L" denotes the remaining word lines of the memory block. For the erase operation, "Sel. W/L denotes the word lines of the selected memory block for which the erase operation is to be executed, and "Unsel. W/L denotes the word lines of the remaining memory blocks in the memory cell array.

A NAND flash programming operation will now be described with reference to FIGS. 3B and 4. Here, string select signal SSL is set to VDD, ground select signal GSL is set to 0 v, the common source line CSL voltage is set to between VSS and VDD (e.g., 1.5 v), and the bulk voltage is set to 0 v. Generally, programming occurs one word line at a time, and accordingly, one word line is selected per memory block for each programming operation. Here, the selected word line W/L receives a programming voltage Vpgm, while the remaining unselected word lines W/L receive a voltage Vpass, where Vpgm is greater than Vpass. Vpgm is of a sufficiently high voltage (e.g., 18 v) that FN tunneling results when the bit line B/L voltage of any cell transistor of the selected word line is 0 v. In other words, when the bit line B/L voltage of any cell transistor of the selected word line is 0 v, the program voltage Vpgm creates a voltage difference (e.g., 18 v) which is sufficient to initiate FN tunneling, thus placing the cell transistor in a programmed state. On the other hand, when the bit line B/L voltage of any cell transistor is VDD, FN tunneling is inhibited as a result of insufficient voltage difference (e.g., 10 v). As such, the cell is said to be "program inhibited". In the meantime, the pass voltage Vpass is sufficiently high to place the non-selected cell transistors in a conductive state, but not so high as to cause FN tunneling.

Referring to FIGS. 3B and 5, a read operation will now be described. In this case, string select signal SSL is set to Vread, ground select signal GSL is set to Vread, the common source line CSL voltage is set to 0 v, and the bulk voltage is set to 0 v. As with programming, the read operation typically occurs one word line at a time, and accordingly, one word line is selected per memory block for each read operation. Here, the selected word line W/L is set to 0 v, while the remaining unselected word lines W/L receive a read voltage Vread. In this example, Vread is 4.5 v, which exceeds the threshold voltage distributions of the "1" and "0" cell transistors. Therefore, the cell transistors coupled to the non-selected word lines become conductive. On the other hand, the 0 v voltage applied to the selected word line falls between the threshold voltage distributions of the "1" and "0" cell transistors. As such, only the "1" cell transistors connected to the selected word line become conductive, whereas the remaining cell transistors of the selected word line are nonconductive. The result is a voltage difference among the bit lines B/L of the memory block. In the example given in the table of FIG. 3B, a bit line B/L voltage of about 1.2 v is read as having a "0" state cell transistor at the selected word line, and a bit line voltage of less than 0.8 v is read as having a "1" state cell transistor at the selected word line.

Referring to FIGS. 3B and 6, an erase operation will now be described. In this case, the bit lines B/L, string select signal SSL, ground select signal GSL, common source line CSL, and the word lines of the unselected memory blocks are all set to a floating state. On the other hand, the selected word line voltage is set to 0 v, and the bulk voltage is set to Verase (e.g., 19-21 v). As such, a negative voltage difference is formed between the control gate and the bulk, resulting in FN tunneling across the gate oxide between the floating gate and the substrate. As a result, the threshold voltage distribution is reduced from the programmed "0" state to the erased "1" state. Note that all the cell transistors of the selected memory block are in the erased "1" state after the erase operation.

As previously mentioned, reading and programming of the memory block are executed one word line at a time within the memory block. In some applications, however, it is more accurate to say that these operations are executed "page by page" within the memory block. This concept is generally illustrated in FIG. 7. In the illustrated example, the bit lines BL <k:0> are divided into even and odd bit lines BL E<k:0> and BL_O <k:0>. The cell transistors of each word line constitute pages of the memory block, and in the example of FIG. 7, each word line is connected to an odd page and an even page of the memory block. As will be explained in more below, the page buffers PB <k:0> contained in a page buffer block are utilized to transmit read data from, and program data to, the flash memory block. Generally, one page buffer PB is provided for each pair of odd and even bit lines.

FIG. 8 is a block diagram illustrating core elements of one example of a NAND-type flash memory, in which a so-called "Y-gating" technique is utilized to access bit lines of the memory. As shown, a plurality of page buffer blocks PBB <31:0> are connected via bit lines BL <255:0> to a memory cell array MCARR. Each page buffer block PBB interfaces with eight bit lines BL. Although not shown in FIG. 8, each bit line BL is actually constituted by a pair of odd and even bit lines as discussed previously in connection with FIG. 7.

A plurality of page buffer decoders PBDE <31:0> are operatively coupled to the respective page buffer blocks PBB <31:0>, y address lines Ya <7:0>, y address lines Yb <31:0>, and a global data bus GDB. As will be explained in more detail below, the y address lines Ya <7:0> are commonly applied to all of the page buffer decoders PBDE <31:0>, whereas individual ones of the y address lines Yb <31:0> are applied to the respective page buffer decoders PBDE <31:0>. In other words, page buffer decoder PBDE0 receives y addresses Ya <7:0> and Yb0, page buffer decoder PBDE1 receives y addresses Ya <7:0> and Yb1, and so on. Internal data lines IDB <255:0> are coupled between the page buffer blocks PBB <31:0> and page buffer decoders PBDE <31:0>. In the example of FIG. 8, eight internal data lines IDB are provided between each corresponding pair of page buffer block PBB and page buffer decoder PBDE.

Also applied to the page buffer blocks PBB <31:0> are data input selection signals DI and nDI, and latch signals LCH <7:0>, the functions of which are described below in connection with FIG. 9.

FIG. 9 is a schematic circuit diagram for explaining the page buffers PB and the page buffer decoders PBDE illustrated in FIG. 8. For convenience of explanation, FIG. 9 illustrates the page buffers PB<7:0> in a side-by-side arrangement (i.e., juxtaposed in the word line direction). In reality, however, the page buffers are stacked one over the other (i.e., juxtaposed in the bit line direction).

The page buffer decoder PBDE0 of FIG. 9 includes a first transistor connected between the global data bus GDB and a common internal data line IDBC, and a plurality of second transistors connected between the common internal data line and respective internal lines IDB <7:0> of the page buffers PB <7:0>. As shown, the gate of the first transistor receives the y address signal Yb0, while the respective gates of the second transistors receive the y address signals Ya <7:0>. It should thus be apparent that the y address Yb <31:0> is used to selected any one of the page buffer blocks PBB <31:0>, and the y address Ya <7:0> is used to select a bit line BL within the selected page buffer block PBB.

The page buffer PB0 includes a latch circuit having a latch node CMNLA and an inverted latch node CMNLAn. First and second transistors of the page buffer PB0 are respectively controlled by the data input selection signals DI and nDI, and these transistors are connected between internal data line IDB0 and the inverted latch node CMNLAn and latch node CMNLA, respectively. Another transistor is controlled by a page buffer select signal PBSLT, and is connected between the latch node CMNLA and a sense node NSEN0. The sense node NSEN0, which is connected to a memory cell string of the memory cell array, is selectively connected to voltage VDD by operation of another transistor which is controlled by a load control signal PLOAD. Finally, two more transistors are connected in series between the internal data line IDB and a reference voltage VSS. One of these two transistors is controlled by the voltage appearing on the sense node NSEN0, while the other is controlled by the latch signal LCH<0>.

Briefly, in a programming operation, the latch circuit of the page buffer PB0 stores a logic value as dictated by the data input selection signals DI and nDI and the voltage of the internal data line IDB, and this logic value (i.e., the voltage appearing on latch node CMNLA) is then transferred to the bit line of the memory cell string for programming. Likewise, in a reading operation, the sensed voltage appearing on the sense node NSEN0 is temporarily stored in the latch circuit, and then transferred to the global data bus GDB via the internal data line IDB. Note that the internal data line IDB functions as a shared input and output line.

Conventional non-volatile memory devices described above suffer from a number of drawbacks, particularly as the layout area of the various circuits is reduced as the memory devices become more integrated to meet demands for higher memory capacities. Without intending to provide an exhaustive listing, some examples of these drawbacks are discussed below.

Parasitic capacitive coupling between internal data lines can result as illustrated in FIG. 10. As mentioned previously, and as shown in FIG. 10, the page buffers <7:0> of each page buffer block PBB are juxtaposed (stacked) in the bit line direction, i.e., between the page buffer decoder PBDE and the memory cell array MCARR. Also illustrated are a number of transistors which are controlled by a sense node blocking signal SOBLK so as to selectively couple the sense nodes SON <7:0> to the bit lines BL<7:0>, respectively.

The internal data lines IDB of the respective page buffers PB all extend in parallel to each other within the page buffer block PBB. As the layout area of the page buffers PB is reduced, the pitch P between adjacent internal data lines IDB becomes smaller, and accordingly, capacitive coupling increases between adjacent internal data lines IDB. The resultant coupling noise between adjacent internal data lines IDB can cause signal distortion and data errors.

The large parasitic capacitance of the internal data lines IDB can also create a charge sharing condition with the low capacitive latch node of the latch circuit of each page buffer PB. In some cases, this can result in the data being flipped. Further, the heavy output load of the internal data lines IDB makes it necessary to increase the output drive capability of the page buffers, which can be problematic when space and power resources are limited.

Also, referring again to FIG. 8, the bus region of the illustrated example includes 40 y address lines. This relatively large number of lines must be attended by a large layout area for the bus region of the device, thus occupying scarce space resources.

SUMMARY OF THE INVENTION

According to an aspect of the present invention, a non-volatile memory device is provided which is operable in a programming mode and a read mode. The memory device includes a memory cell array which includes a plurality of non-volatile memory cells, a plurality of word lines, and a plurality of bit lines. The memory device further includes an internal data output line for outputting data read from the bit lines of the memory array, and a page buffer operatively connected between a bit line of the memory cell array and the internal data output line. The page buffer includes a sense node which is selectively connected to the bit line, a latch circuit having a latch node which is selectively connected to the sense node, a latch input path which sets a logic voltage of the latch node, and a latch output path which is separate from the latch input path and which sets as logic voltage of the internal data output line according to the logic voltage of the latch node.

According to another aspect of the present invention, a non-volatile memory device is provided which includes a memory cell array which includes a plurality of non-volatile memory cells, a page buffer which includes a latch circuit for temporarily storing data read from and programmed into the non-volatile memory cells of the memory cell array, an internal data output line which outputs data read from the memory cell array and temporarily stored in the page buffer, a latch input path which is separate from the internal data output line and which sets the latch circuit when data is to be programmed into the non-volatile memory cells of the memory cell array and when data is read from the non-volatile memory cells of the memory cell array.

According to still another aspect of the present invention, a non-volatile memory device is provided which includes a memory cell array which includes a plurality of non-volatile memory cells, an input data bus which inputs data to be programmed into the non-volatile memory cells of the memory cell array, an output data bus which is separate from the input data bus and which outputs data read from the non-volatile memory cells of the memory cell array, a latch circuit for temporarily storing data read from and programmed into the non-volatile memory cells of the memory cell array, an internal data output line connected to the output data bus, a latch input path connected to the input data bus which sets the latch circuit when data is to be programmed into the non-volatile memory cells of the memory cell array, and an output drive circuit which transfers read data temporarily stored in the latch circuit to the internal data output line.

According to yet another aspect of the present invention, a non-volatile memory device is provided which includes a memory cell array which includes a plurality of non-volatile memory cells, a plurality of word lines, and a plurality of bit lines. The memory device further includes an internal data output line and a plurality of page buffers connected to the memory cell array and the internal data output line. The page buffer are arranged one after the other to define a corresponding plurality of juxtaposed page buffer regions, where each of the page buffers includes a latch circuit which temporarily stores data read from the memory cell array, and an address gate connected between the latch circuit and the internal data output line. The address gate is responsive to an address signal to selectively output the data from the latch circuit of each page buffer to the internal data output line.

According to another aspect of the present invention, a non-volatile memory device is provided which includes a memory cell array which includes a plurality of non-volatile memory cells, a plurality of word lines, and a plurality of bit lines, where the plurality of bit lines extend lengthwise in a first direction. The memory device further includes a shared internal data output line which outputs data read from the memory cell array, a plurality of internal data input lines, and a plurality of page buffers which are each operatively connected between the memory cell array, the shared internal data output line, and the plurality of internal data input lines.

According to still another aspect of the present invention, a non-volatile memory device is provided which includes a memory cell array which includes a plurality of non-volatile memory cells, and a page buffer which includes a local data input line and a latch circuit. The latch circuit is responsive to the local data input line to temporarily store data read from and programmed into the non-volatile memory cells of the memory cell array. The memory device further includes a global data input line which supplies external input signals, where the external input signals include programming signals to program the memory cell array and control signals to read the memory cell array, and a gate circuit which selectively outputs the external input signals to the local data input line according to an address signal supplied to the gate circuit.

According to yet another aspect of the present invention, a nonvolatile memory device is provided which includes a memory cell array which includes a plurality of non-volatile memory cells, a plurality of word lines, and a plurality of bit lines. The memory device further includes an internal data output line which outputs data read from the memory cell array, a plurality of page buffers which are operatively connected between the memory cell array and the internal data output line, and a plurality of address lines operatively connected to at least one gate circuit of the plurality of page buffers.

According to another aspect of the present invention, a page buffer for a non-volatile memory device is provided. The page buffer includes a latch circuit including a latch node, an internal data input line which controls a voltage of the latch node, an internal data output line which is electrically isolated from the latch node, and an output drive circuit which controls a voltage of the internal output data line according to the voltage of the latch node.

According to still another aspect of the present invention, a nonvolatile semiconductor memory device is provided which includes a memory cell array having a plurality of electrically programmable and erasable memory cells, a plurality of word lines, and a plurality of bit lines. The memory device further includes at least one page buffer block including a plurality of page buffers and an internal data output line. The page buffers are respectively connected to the bit lines and each is enabled in response to at least one of a plurality of buffer selection addresses. The page buffers each store data corresponding to data on a bit line thereof on a latch node thereof. The internal data output line is shared between the plurality of page buffers and is driven by data on a latch node of an enabled page buffer. The internal data output line is electrically isolated from latch nodes of the page buffers.

BRIEF DESCRIPTION OF THE DRAWINGS

The above and other aspects and features of the present invention will become readily apparent from the detailed description that follows, with reference to the accompanying drawings, in which:

FIGS. 1A through 1C are a schematic diagram of a flash memory cell, a circuit symbol of a flash memory cell, and a threshold voltage characteristic diagram of a flash memory cell, respectively;

DETAILED DESCRIPTION OF PREFERRED EMBODIMENTS

The present invention will now be described by way of preferred but non-limiting embodiments.

Figure 11:
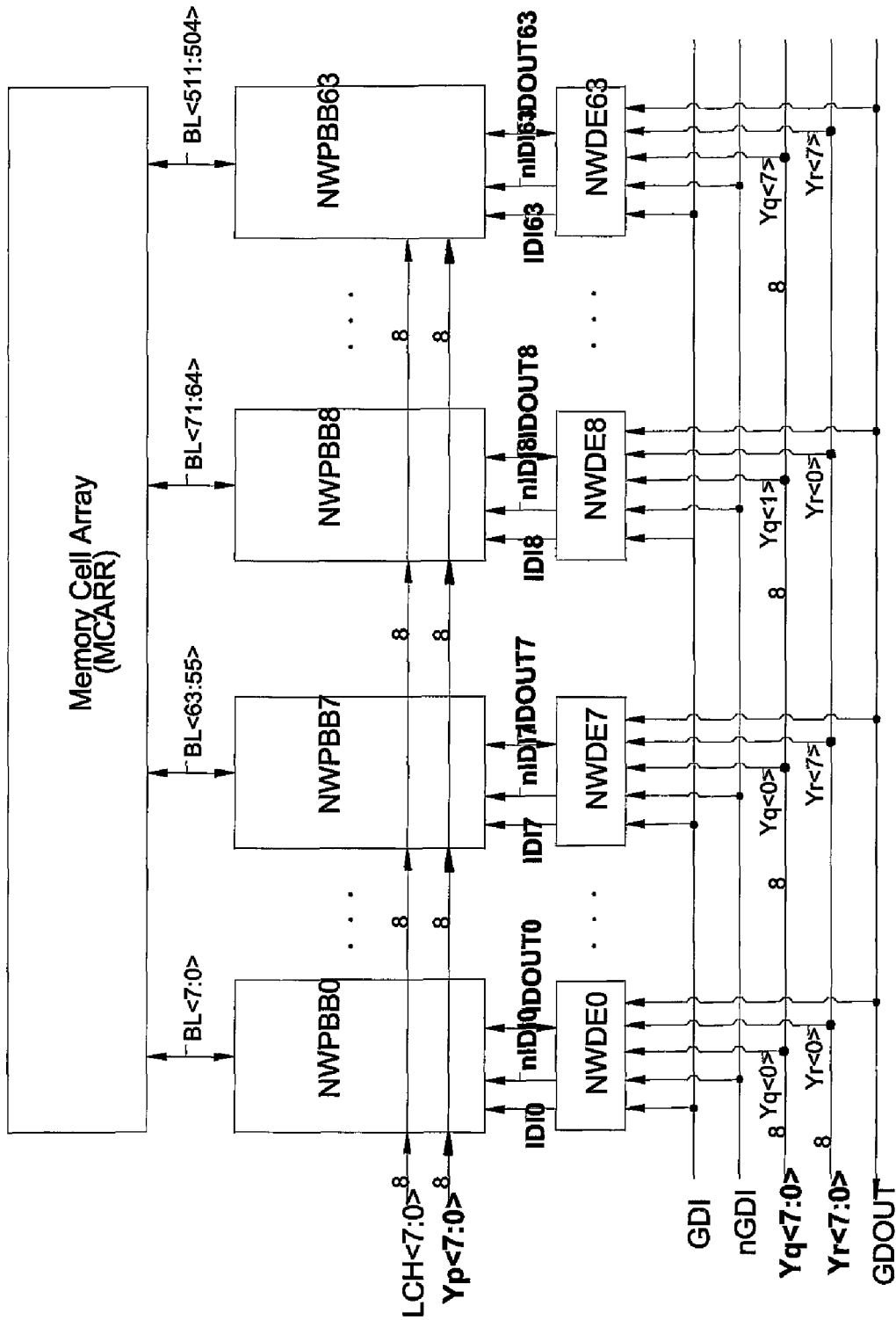
FIG. 11 is a block diagram of a nonvolatile semiconductor memory device according to an embodiment of the present invention.

FIG. 11 is a schematic block diagram of a nonvolatile semiconductor memory device according to an embodiment of the present invention.

Referring to FIG. 11, the nonvolatile semiconductor memory device of this example includes a memory cell array MCARR, page buffer blocks NWPBB<63:0>, first and second global input lines GDI and nGDI, a global output line GDOUT, y address signal lines Yp<7:0>, Yq<7:0> and Yr<7:0>, read latch signal lines LCH<7:0>, and page buffer decoders NWDE<63:0>.

The memory cell array MCARR includes a matrix array of memory cells, word lines WL (not shown in FIG. 11) and bit lines BL<511:0>. In the example of this embodiment, the memory cells are flash memory cell transistors.

Internal input lines IDI<63:0> and nIDI<63:0>, and internal output lines IDOUT<63:0>, are connected between the page buffer decoders NWDE<63:0> and corresponding page buffer blocks NWPBB<63:0>.

The first global input line GDI and the second global input line nGDI transmit input data of opposite logic states during predetermined operational intervals, such as a read mode, a program mode and an erase mode. As will be explained in more detail later, each of the page buffer decoders NWDE<63:0> decodes the input data GDI and nGDI, together with the y address data Yq<7:0> and Yr<7:0>, to output the data of the internal input lines IDI<63:0> and nIDI<63:0>.

Also, each of the page buffer decoders NWDE<63:0> provides data corresponding to the data on the internal output lines IDOUT<63:0> to the global output line GDOUT.

The page buffer blocks NWPBB<63:0> are responsive to the latch signal lines LCH<7:0> and the y address Yp<7:0>. As will be explained later herein, the page buffer blocks NWPBB<63:0> function to temporarily store and then transmit input data corresponding to data on the internal input lines IDI<63:0> and nIDI<63:0> to the bit lines BL<511:0>, and to temporarily store and then transmit output data corresponding to data on bit lines BL<511:0> to the internal output lines IDOUT<63:0>.

Figure 12:
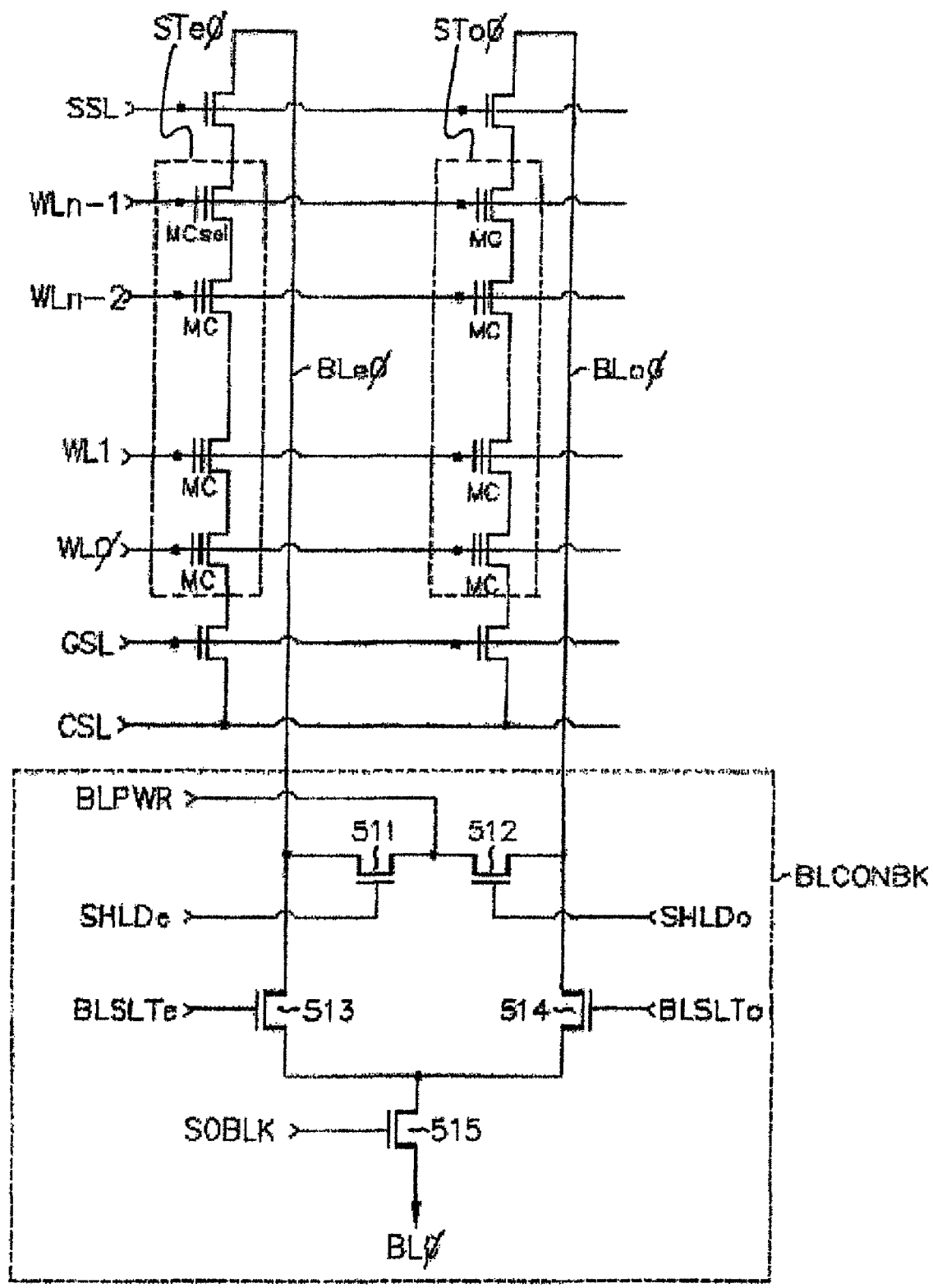
FIG. 12 is a schematic diagram of an example of a memory array contained in the nonvolatile memory of FIG. 11.

FIG. 12 is a view of a portion of the memory cell array MCARR of FIG. 11 according to the example of this embodiment. In particular, FIG. 12 illustrates circuitry associated with the memory cell strings of the first bit line BL0 of FIG. 11. Bit lines BL<511:1> are similarly configured.

As discussed above, the memory cell array MCARR generally includes a matrix array of memory cells MC, a plurality of word lines WL<n−1:0>, and a plurality of bit lines BL<511:0>. The memory cells MC of the nonvolatile semiconductor memory device of the embodiment are NAND-type flash memory cells.

FIG. 12 illustrates the first and second strings STe0 and STo0 connected to the even and odd bit lines BLe0 and BLo0 which make up the bit line BL0 of FIG. 11. Each string STe0 and STo0 includes transistors at opposite ends of the memory cells MC which are connected to select lines SSL and GSL. As shown, the select lines SSL and GSL run parallel to the word lines WL<n−1:0>. Also, each string STe0 and STo0 terminates at a common source line CSL.

The even and odd bit lines are connected to a bit line control block BLCONBK. For ease of explanation and to simplify previously discussed FIG. 11, the bit line control block BLCONBK is described here as forming part of the memory cell array MCARR. However, the bit line control block BLCONBK may also be viewed as a circuit that is separate and distinct from the memory cell array MCARR.

In each of read, program and erase operational modes, the bit line control block BLCONBK selects one of the even bit line BLe0 and the odd bit line BLo0 and connects the selected bit line to the bit line BL0. This operation is executed by the transistor 515 which is controlled by the sense node blocking signal SOBLK, and by the transistors 513 and 514 which are respectively controlled by the even bit line selection signal BLSLTe and the odd bit line selection signal BLSLTo.

In addition, the bit line control block BLCONBK functions to pre-charge or condition the voltages of the even bit line BLe0 and the odd bit line BLo0 in the read, program mode and erase operational modes. Transistors 511 and 512 are provided for this purpose. That is, transistor 511 is responsive to an even shielding signal SHLDe to selectively connect a bit line power voltage BLPWR to the even bit line BLe0, and the transistor 512 is responsive to an odd shielding signal SHLDo to selectively connect the bit line power voltage BLPWR to the odd bit line BLo0.

Figure 13:
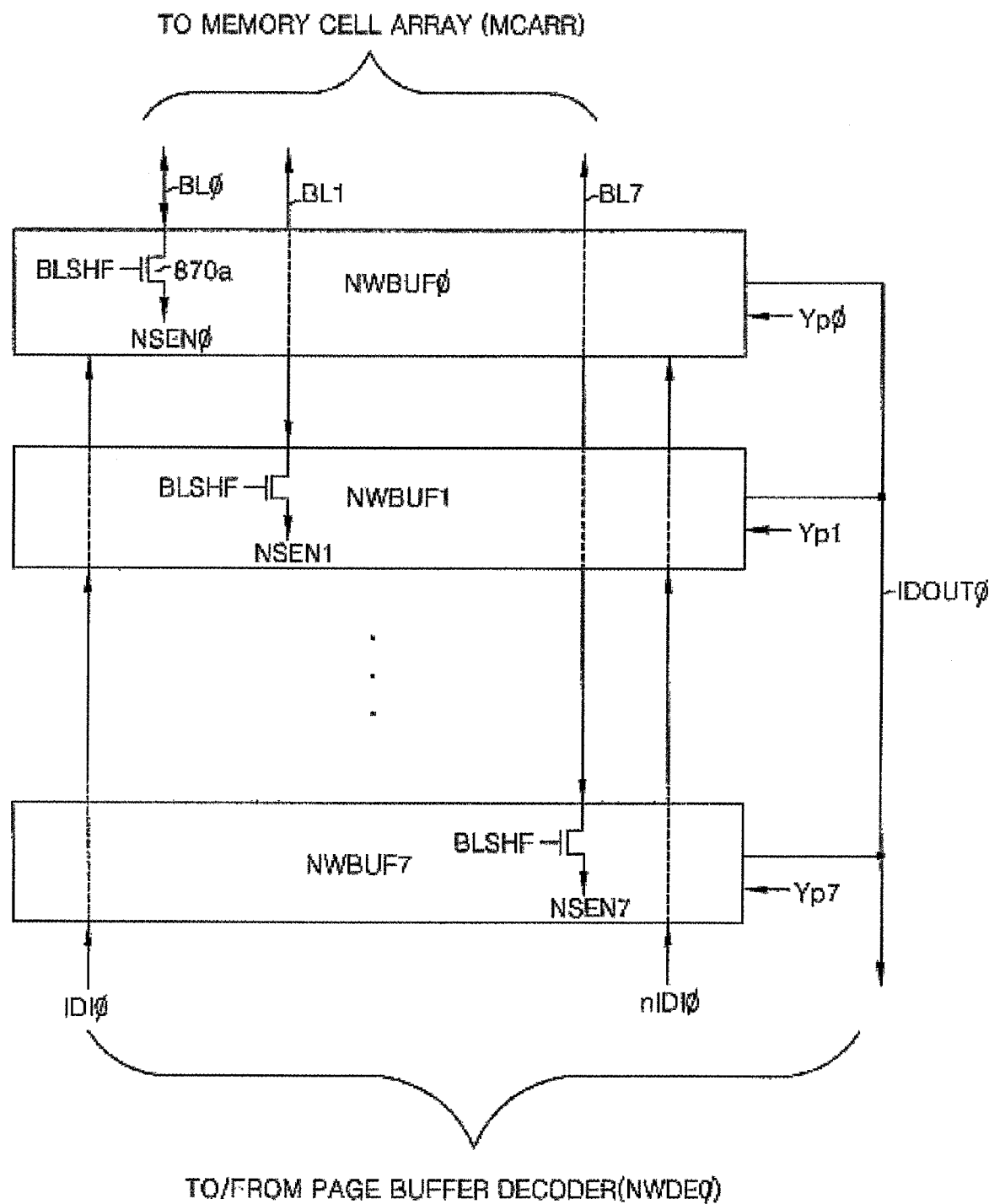
FIG. 13 is a diagram of an example of a page buffer block contained in the nonvolatile memory of FIG. 11.

FIG. 13 illustrates an example of the page buffer block NWPBB0 illustrated in FIG. 11. The remaining page buffer blocks NWPBB<63:1> have similar configurations.

The page buffer block NWPBB0 of FIG. 13 includes a plurality of page buffers NWBUF<7:0>, an internal output line IDOUT0, a first internal input line IDI0, and a second internal input line nIDI0. The page buffers NWBUF<7:0> store data that is transmitted to and received from the bit lines BL<7:0>, respectively.

The internal output line IDOUT0 is a common internal output line for the page buffer block NWPBB0, and transmits output data corresponding to the data stored in any one of the page buffers NWBUF<7:0>.

The first internal input line IDI0 and the second internal input line nIDI0 supply signals which control the storing of data in the page buffers NWBUF<7:0> based on input data.

In order to minimize the necessary layout area, the page buffers NWBUF<7:0> included in the page buffer block NWPBB0 are positioned in a stacked structure, i.e., juxtaposed between the page buffer decoder NWDE0 and the memory cell array MCARR.

Each of the page buffers NWBUF<7:0> of the page buffer block NWPBB is connected between the internal input lines IDI0 and nIDI0 and a corresponding one of bit lines BL<7:0>. Further, each is equipped with a transistor 870a that is responsive to a bit line shutoff signal BLSHF to connect the corresponding bit line BL<7:0> to a respective sense node NSEN<7:0>.

Further, each of the page buffers NWBUF<7:0> receives a respective one of y address signals Yp<7:0>. Contrary to the conventional memory device, in the example of this embodiment, these address signals Yp<7:0> are connected directly to the respective page buffers NWBUF<7:0> (also see FIG. 11). As will be explained later, this results in the dual advantages of reducing the number of lines present in the bus region of the memory, and reducing the overall number of y address lines of the memory. Herein, the Yp<7:0> address signals are referred to as buffer selection address signals.

As shown in FIG. 13, the internal output line IDOUT0 preferably extends in a direction in which the page buffers NWBUF<7:0> are stacked. As such, variations in transmission line distances from the respective page buffers NWBUF<7:0> to the internal output line IDOUT0 are minimized. This in turn increases signal uniformity when loading data from the page buffers NWBUF<7:0> to the internal output line IDOUT0, thus enhancing the sensing margin of the non-volatile memory.

Figure 10:
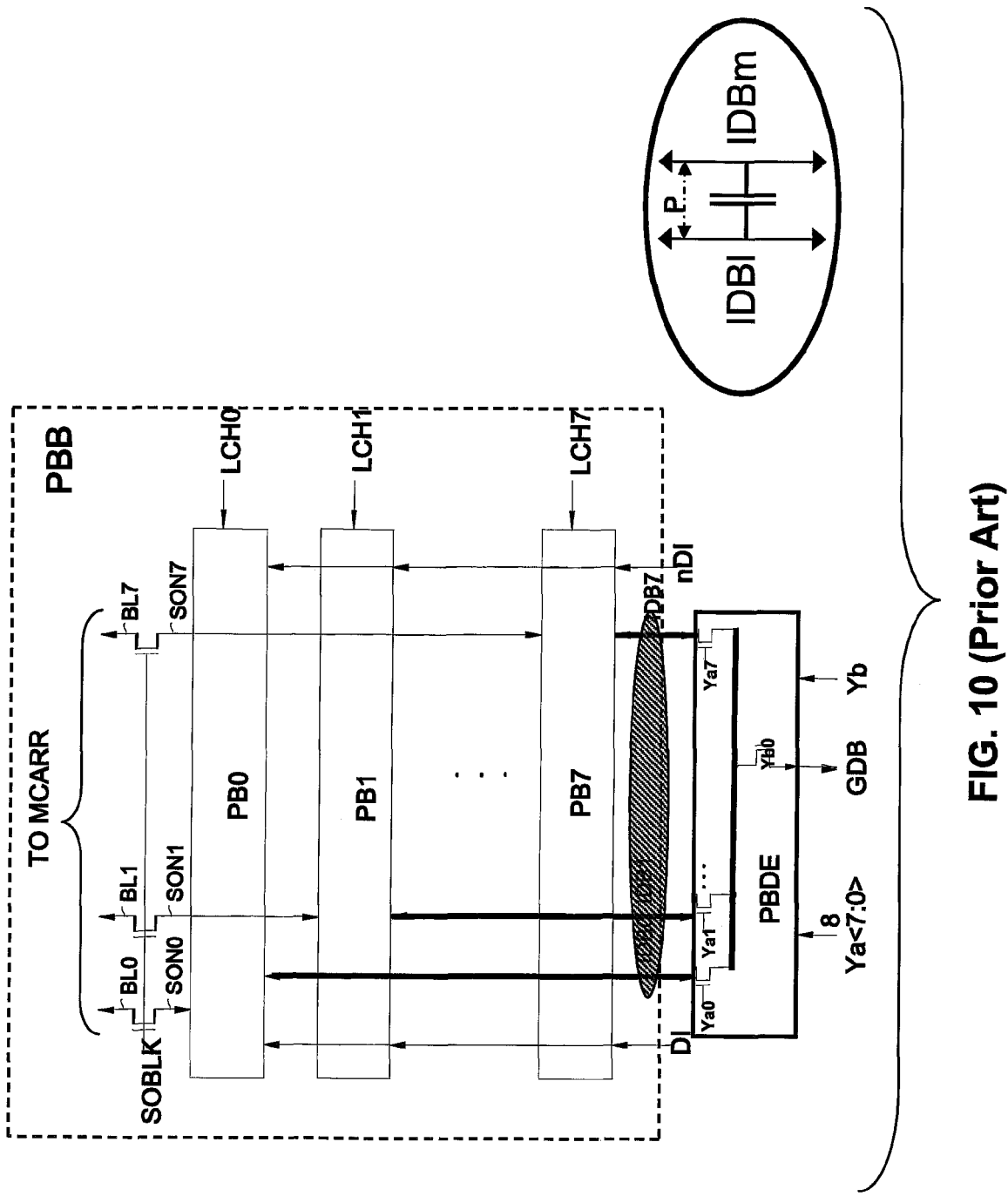
FIG. 10 is diagram illustrating the layout of page buffers within the page buffer block contained in the nonvolatile memory device of FIG. 8.

Further, in the example of the present embodiment, the internal output line IDOUT0 is shared among the page buffers NWBUF<7:0>. One advantage resulting from this configuration is that the problems associated with parasitic coupling of the internal data lines IDB<7:0> of a conventional memory (see FIG. 10) can be avoided.

Figure 14:
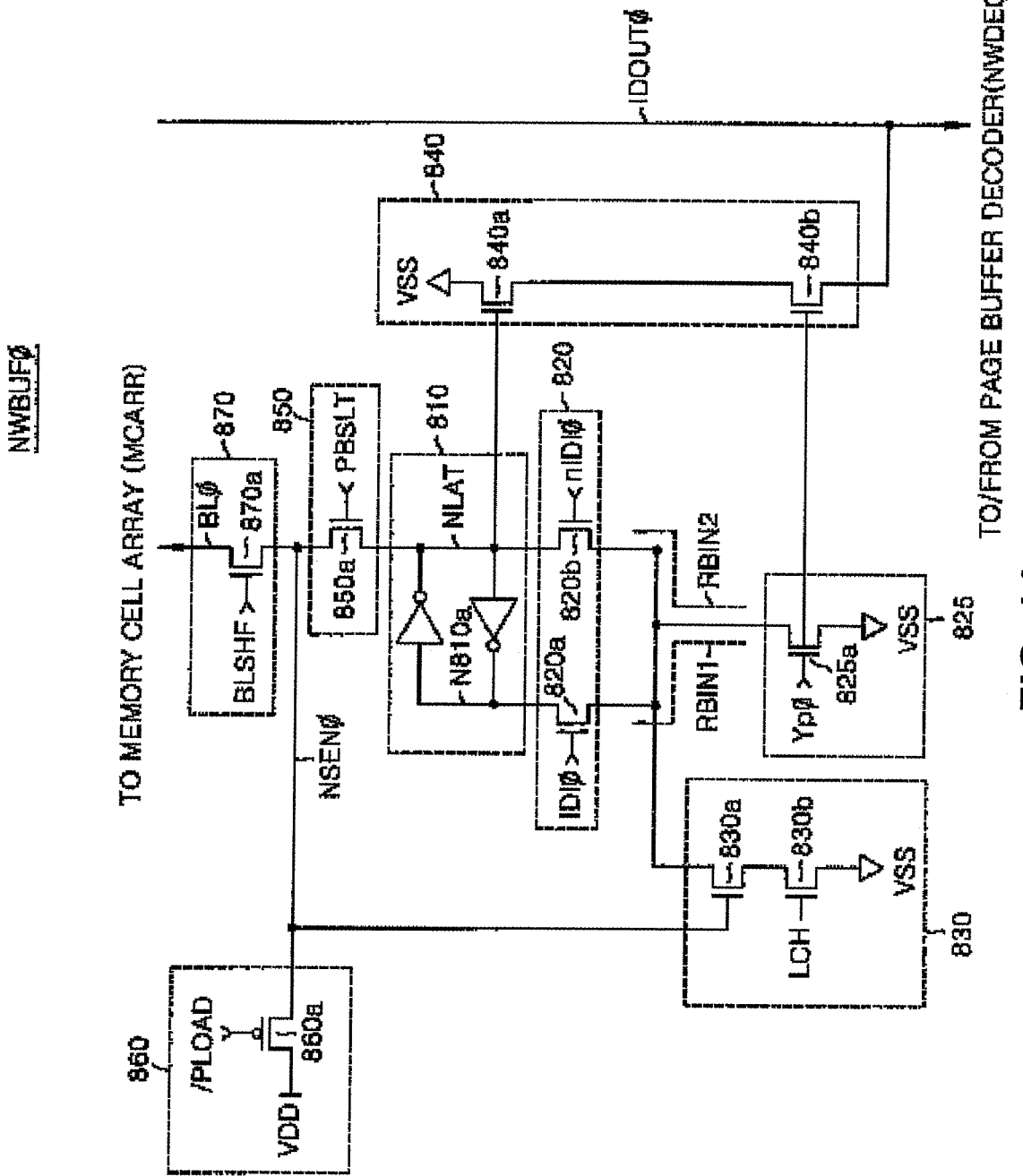
FIG. 14 is a schematic diagram of an example of a page buffer contained in the page buffer block of FIG. 13.

FIG. 14 illustrates an example of the page buffers NWBUF0 of FIG. 13. The remaining page buffers NWBUF<7:1> are similarly configured.

As shown in FIG. 14, the page buffer NWBUF0 includes the sensing node NSEN0, a latch unit 810, a latch transmission unit 820, a latch driving unit 825, a sensing response unit 830, an output driving unit 840, a buffer selection unit 850, a sensing setting unit 860, a bit line shutoff unit 870 and the internal output line IDOUT0. The sensing node NSEN0 receives data provided from the bit line BL0, and is connected to the bit line BL0 through the bit line shutoff unit 870.

The bit line shutoff unit 870 controls the connection of the bit line BL0 to the sensing node NSEN0 in response to a bit line shutoff signal BLSHF. Preferably, the bit line shutoff unit 870 is implemented using a bit line shutoff transistor 870a, which is a low voltage NMOS transistor gated in response to the bit line shutoff signal BLSHF.

The latch unit 810 includes a latch node NLAT which stores data corresponding to data of the bit line BL0.

The latch driving unit 825 is enabled in response to the buffer selection address Yp0 to provide a predetermined latch driving voltage. In this example, the latch driving voltage is the ground voltage VSS, and is independent of the data on the first and second internal input lines IDI0 and nIDI0 provided to the latch transmission unit 820. The latch driving unit 825 of this example includes a latch driving transistor 825a, and preferably, the latch driving transistor 825a is an NMOS transistor that is gated in response to the buffer selection address Yp0 and has a source terminal connected to the ground voltage VSS.

The latch transmission unit 820 of this example includes first and second latch transmission transistors 820a and 820b. The first latch transmission transistor 820a provides the latch driving voltage provided from the latch driving transistor 825a to a node N810a of the latch unit 810 in response to the first internal input line IDI0. Preferably, the first latch transmission transistor 820a is connected to the latch driving transistor 825a and is gated in response to the data on the first internal input line IDI0. Therefore, if data of a logic "H" state is applied to the first internal input line IDI0 when the buffer selection address Yp0 is in a logic "H" state, the first latch transmission transistor 820a provides the ground voltage VSS to the node N810a of the latch unit 810.

The second latch transmission transistor 820b of this example provides the latch driving voltage provided from the latch driving transistor 825a to the latch node NLAT of the latch unit 810 in response to the second internal input line nIDI0. Preferably, the second latch transmission transistor 820b is connected in series with the latch driving transistor 825a and is gated in response to the data on the second internal input line nIDI0. Therefore, if data of a logic "H" state is applied to the second internal input line nIDI0 when the buffer selection address Yp0 is in a logic "H" state, the second latch transmission transistor 820b provides the ground voltage VSS to the latch node NLAT of the latch unit 810.

That is, in the example of this embodiment, when the first latch transmission transistor 820a is turned ON, data of a logic "H" state is stored on the latch node NLAT. On the other hand, when the second latch transmission transistor 820b is turned ON, data of a logic "L" state is stored on the latch node NLAT.

In FIG. 14, RBIN1 and RBIN2 denote buffer input paths through which the latch driving voltage is transmitted to the latch unit 810. That is, the transmission path through the latch driving transistor 825a and the first latch transmission transistor 820a to the latch node NLAT is designated as the first buffer input path RBIN1, and the transmission path through the latch driving transistor 825a and the second latch transmission transistor 820b to the latch node NLAT is designated as the second buffer input path RBIN2.

The sensing response unit 830 of this example is driven by the sensing node NSEN0 to selectively transmit a sensing response voltage to the latch transmission unit 820, to thereby control the data stored at the latch node NLAT. Preferably, the sensing response voltage is the ground voltage VSS. The sensing response unit 830 includes, for example, a sensing response transistor 830a and an output sensing transistor 830b.

Preferably, the sensing response transistor 830a is an NMOS transistor that is gated in response to the data on the sensing node NSEN0. The output sensing transistor 830b is an NMOS transistor that is arranged in series with the sensing response transistor 820a and is provided with a source terminal connected to the ground voltage VSS. When the sensing response transistor 830a is turned on, the output sensing transistor 830b is responsive to a read latch signal LCH to provide the sensing response voltage to the latch unit 810 through the latch transmission unit 820. Further, the latch node NLAT stores data corresponding to the sensing node NSEN0 in response to the sensing response voltage.

The sensing setting unit 860 sets the sensing node NSEN0 at a predetermined setting voltage. In this example, the setting voltage is a supply voltage VDD, and the sensing setting unit 860 includes a sensing setting transistor 860a. The sensing setting transistor 860a is preferably a PMOS transistor that has a source terminal connected to the supply voltage VDD (for example, 2.2V) and is gated in response to a sensing setting signal /PLOAD.

The output driving unit 840 is enabled in response to the buffer selection address Yp0. When enabled, the output driving unit 840 drives the internal output line IDOUT0 to a predetermined drive voltage in response to the data stored on the latch node NLAT. As is apparent in FIG. 14, the internal output line IDOUT0 is separated from and electrically isolated from the latch node NLAT and the buffer input paths RBIN1 and RBIN2.

The output driving unit 840 includes, for example, a first output driving transistor 840a and a second output driving transistor 840b. The first output driving transistor 840a is gated by the data stored on the latch node NLAT of the latch unit 810. In this example, the first output driving transistor 840a is turned on when the data stored on the latch node NLAT of the latch unit 810 is logic "H". The second output driving transistor 840b is connected in series with the first output driving transistor 840a. The second output driving transistor 840b is gated in response to the buffer selection address Yp0 to drive the internal output line IDOUT0 to the drive voltage. In the example, the drive voltage is the ground voltage VSS which is connected to the source terminal of the first output driving transistor 840a. Thus, according to this embodiment, when the data stored on the latch node NLAT is a logic "H" state, the internal output line IDOUT0 is driven to the ground voltage VSS in response to a transition of the buffer selection address Yp0 to the logic "H" state.

The buffer selection unit 850 of this example controls the connection of the latch node NLAT with the sensing node NSEN0. In this example, the buffer selection unit 850 includes a buffer selection transistor 850a, which is an NMOS transistor gated in response to a buffer selection signal PBSLT. When the voltage level of the buffer selection signal PBSLT is changed to a logic "H" state, the data on the latch node NLAT is transmitted to the sensing node NSEN0 through the buffer selection transistor 850a, where it can then be transmitted to the bit line BL0.

Figure 15:
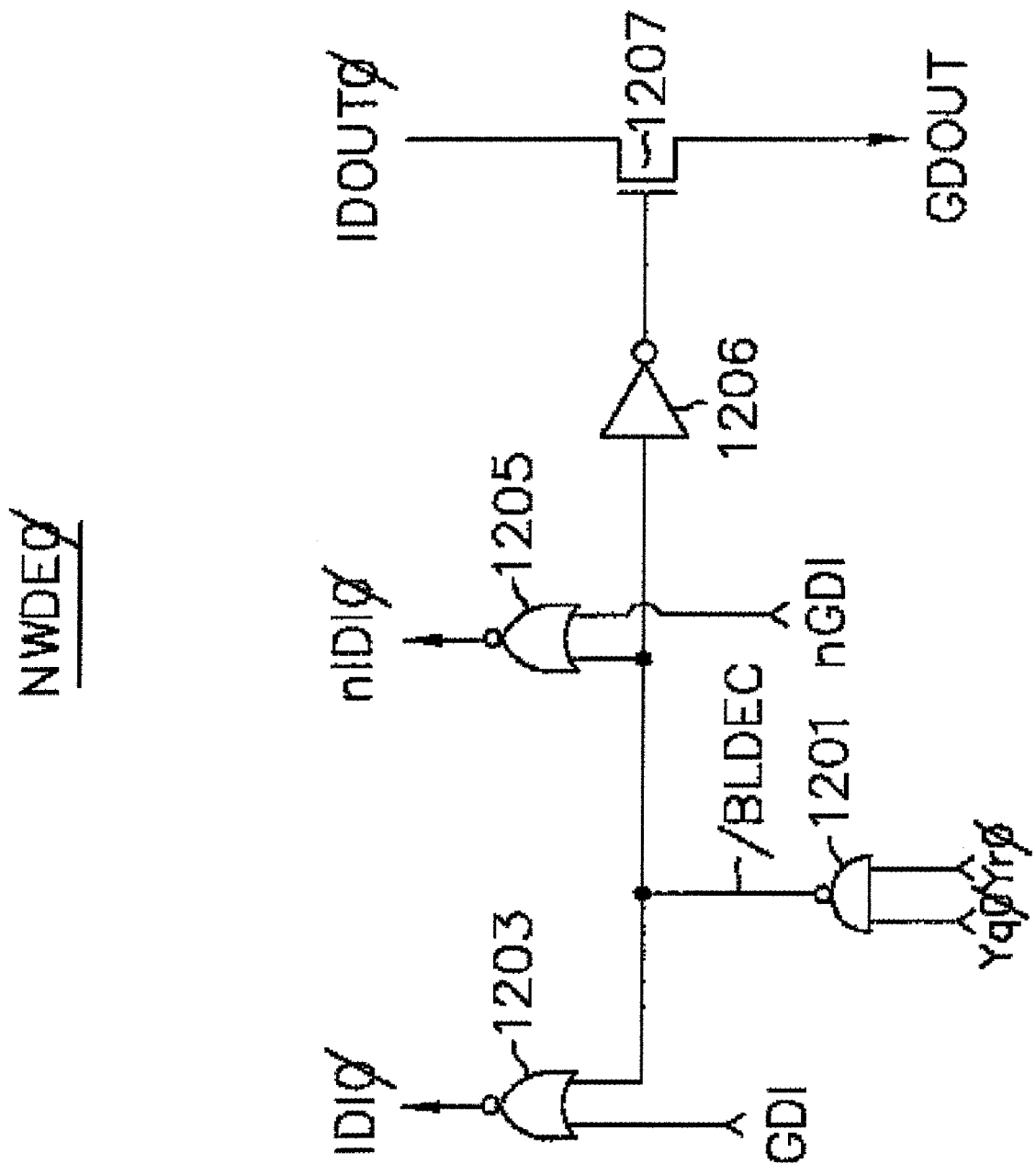
FIG. 15 is a schematic diagram of an example of a page buffer decoder contained in the nonvolatile memory of FIG. 11.

FIG. 15 illustrates an example of the page buffer decoder NWDE0 shown in FIG. 11. The remaining page buffer decoders NWDE<63:1> may be similarly configured.

The page buffer decoder NWDE0 has two primary functions. First, the page buffer decoder NWDE0 transmits output data corresponding to data on the internal output line IDOUT0 to the global output line GDOUT. Second, the page buffer decoder NWDE0 transmits data corresponding to input data on the first global input line GDI and the second global input line nGDI to the first internal input line IDI0 and the second internal input line nIDI0, respectively.

The page buffer decoder NWDE0 in the example of FIG. 15 includes first to third decoder logic gates 1201, 1203 and 1205, an inverter 1206, and a decoder transistor 1207.

Herein, the y address signals Yq<7:0> are referred to as main selection addresses, and the y address signals Yr<7:0> are referred to as sub-selection addresses (see FIG. 11).

The first decoder logic gate 1201 performs a logic operation on a main selection address Yq0 and a sub-selection address Yr0, and outputs the logic operation result as a block decoding signal /BLDEC. In this example, the first decoder logic gate 1201 is a NAND gate which executes NAND operation on the main selection address Yq0 and the sub-selection address Yr0, and outputs the NAND operation results as the block decoding signal /BLDEC. In this case, when both the main selection address Yq0 and the sub-selection address Yr0 are activated to a logic "H" state, the block decoding signal /BLDEC is activated to a logic "L" state.

The second decoder logic gate 1203 is enabled in response to the block decoding signal /BLDEC, and provides logic operation results to the first internal input line IDI0 in accordance with data on the first global input line GDI. In this example, the second decoder logic gate 1203 is a NOR gate which executes a NOR operation on the block decoding signal /BLDEC and the first global input line GDI. In this case, the second decoder logic gate 1203 inverts the data on the first global input line GDI and provides the inverted result to the first internal input line IDI0 when the block decoding signal /BLDEC is in a logic "L" state (i.e., when both the main selection address Yq0 and the sub-selection address Yr0 are in a logic "H" state).

The third decoder logic gate 1205 is enabled in response to the block decoding signal /BLDEC and provides logic operation results to the second internal input line nIDI0 in accordance with data on the second global input line nGDI. In this example, the third decoder logic gate 1205 is a NOR gate which executes a NOR operation on the block decoding signal /BLDEC and the second global input line nGDI. In this case, the third decoder logic gate 1205 inverts data on the second global input line nGDI and provides the inverted data to the second internal input line nIDI0 thereof when the block decoding signal /BLDEC is in a logic "L" state (i.e., when both the main selection address Yq0 and the sub-selection address Yr0 are in a logic "H" state).

The inverter 1206 inverts the block decoding signal /BLDEC to gate the decoder transistor 1207. As such, in this example, the decoder transistor 1207 provides data on the internal output line IDOUT0 to the global output line GDOUT when the block decoding signal /BLDEC is activated to a logic "L" state.

In the example of the present embodiment, the nonvolatile memory includes 64 page buffer decoders NWDE<63:0>. The page buffer decoders NWDE<63:0> are individually selected based on a combination of the main selection addresses Yq<7:0> and sub-selection addresses Yr<7:0>. The main selection addresses Yq<7:0> are used to select one of 8 groups (having 8 buffer decoders each) among the 64 page buffer decoders NWDE<63:0>, and the sub-selection addresses Yr<7:0> are used to select any one of 8 page buffer decoders contained in the selected group. Also, as mentioned previously, the buffer selection addresses Yp<7:0> are used to select individual ones of 8 page buffers associated with the selected buffer decoder.

Figure 2:
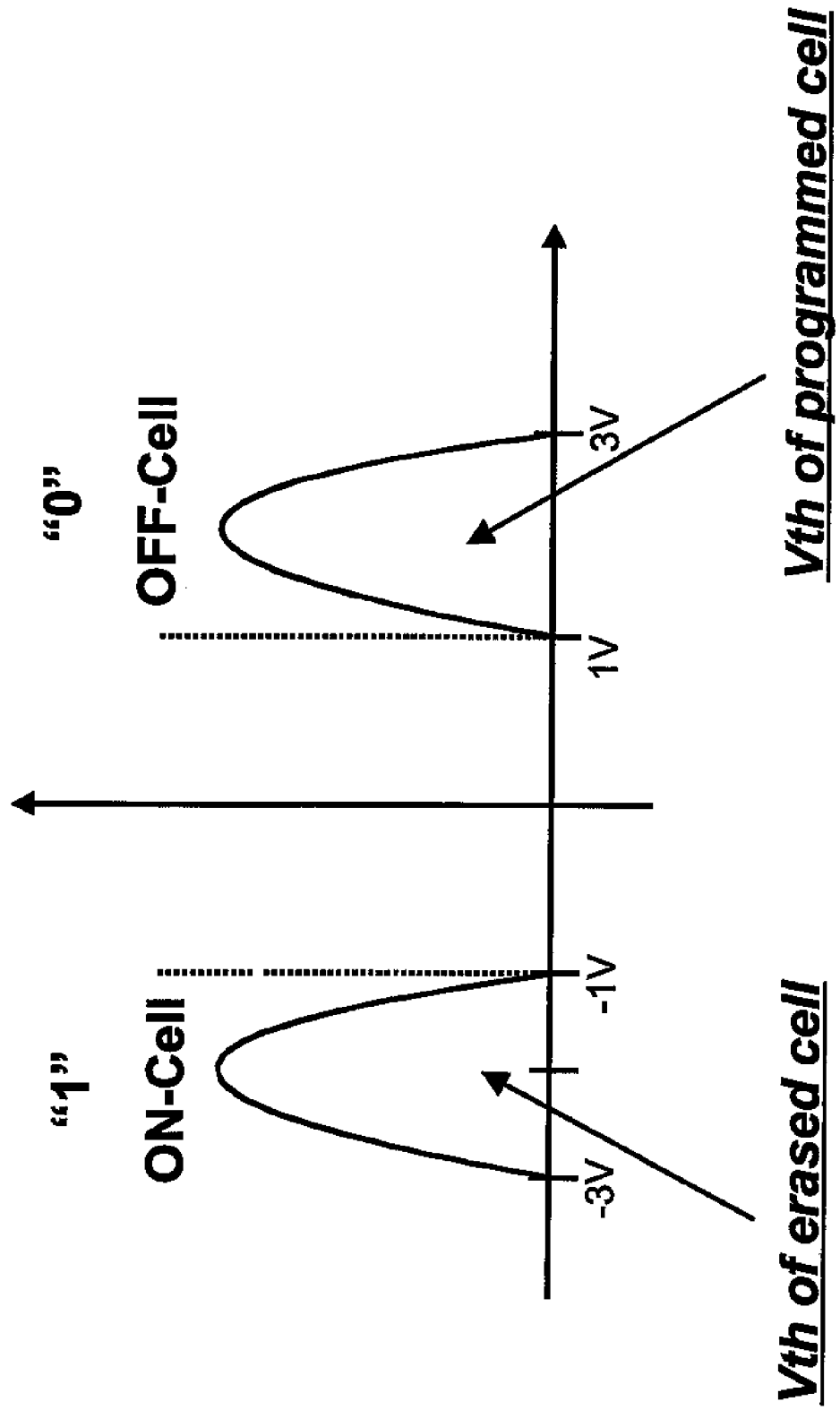
FIG. 2 illustrates threshold voltage distributions of flash memory cells.
Figures 3A, 3B:
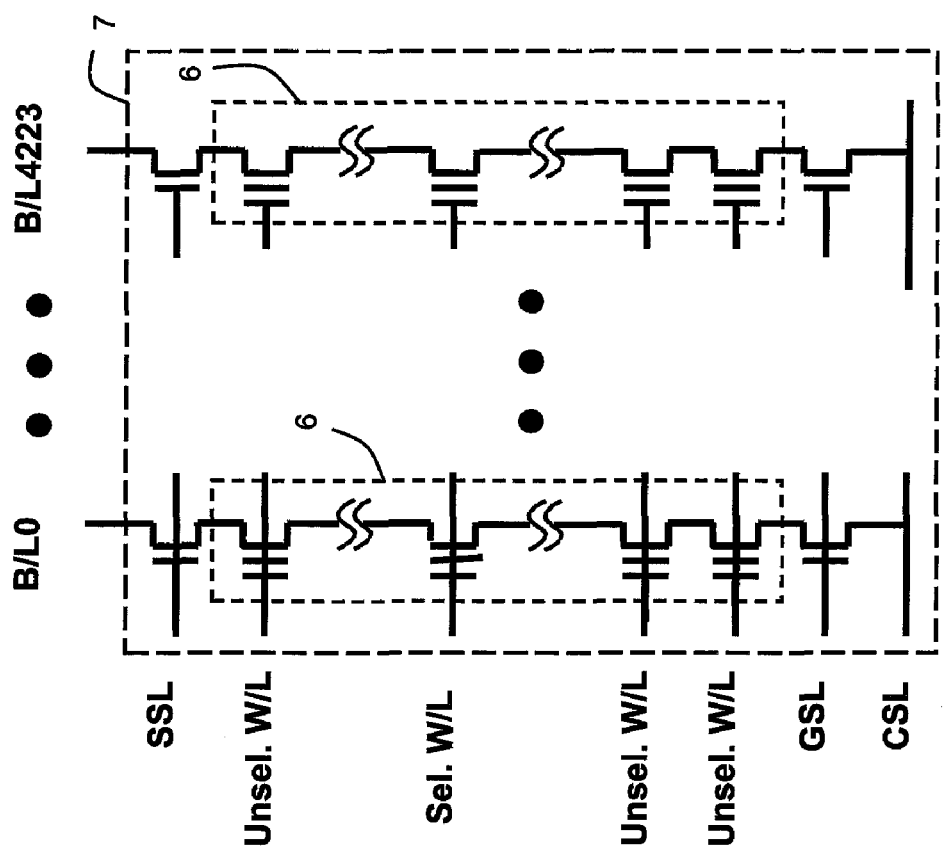
FIGS. 3A and 3B are a schematic diagram of NAND-flash memory cell block, and a table showing erase, program and read voltages of a NAND-flash memory cell block, respectively.
Figure 4:
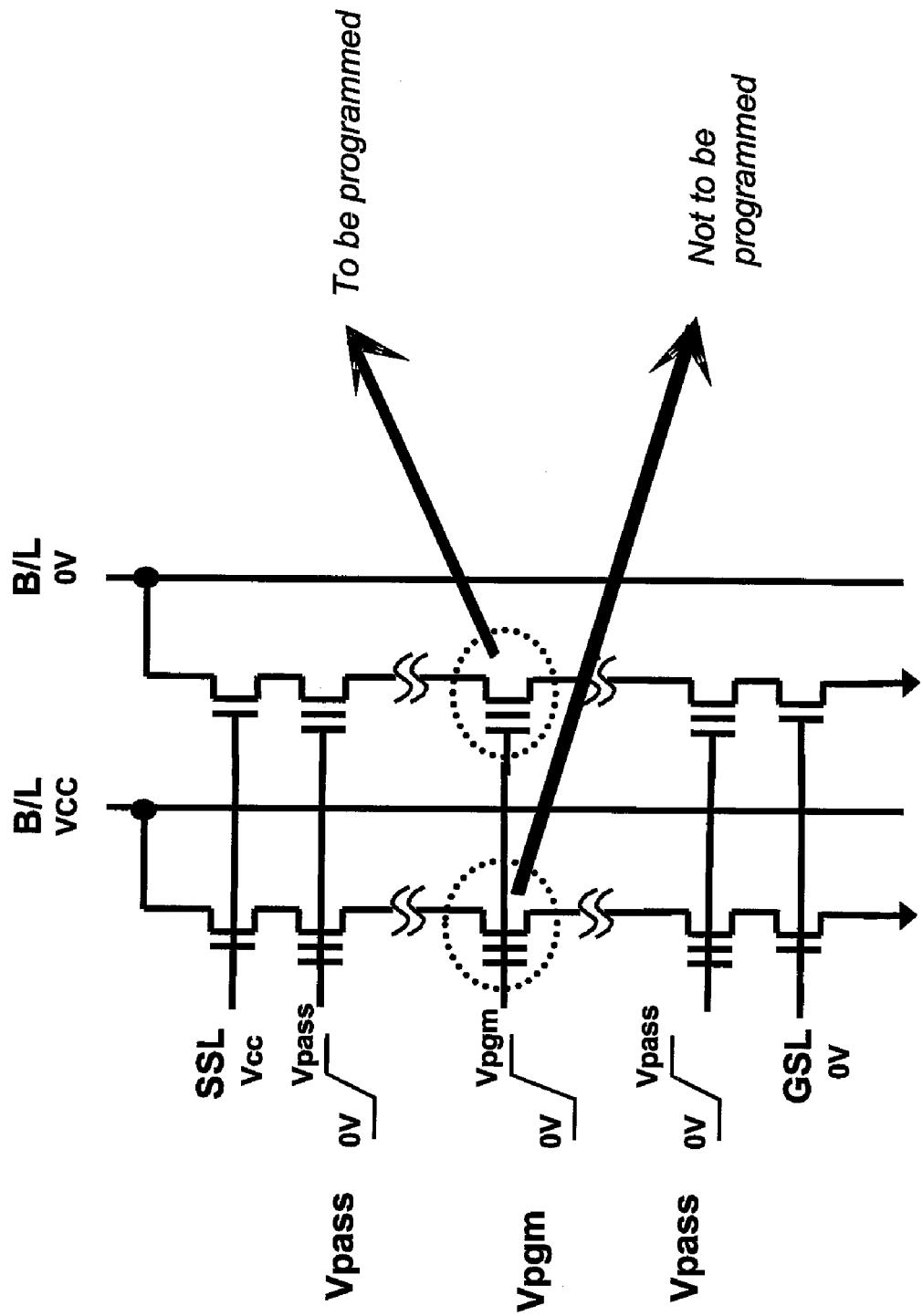
FIG. 4 is a diagram for explaining the programming of the NAND-flash memory cell block shown in FIG. 3A.
Figure 5:
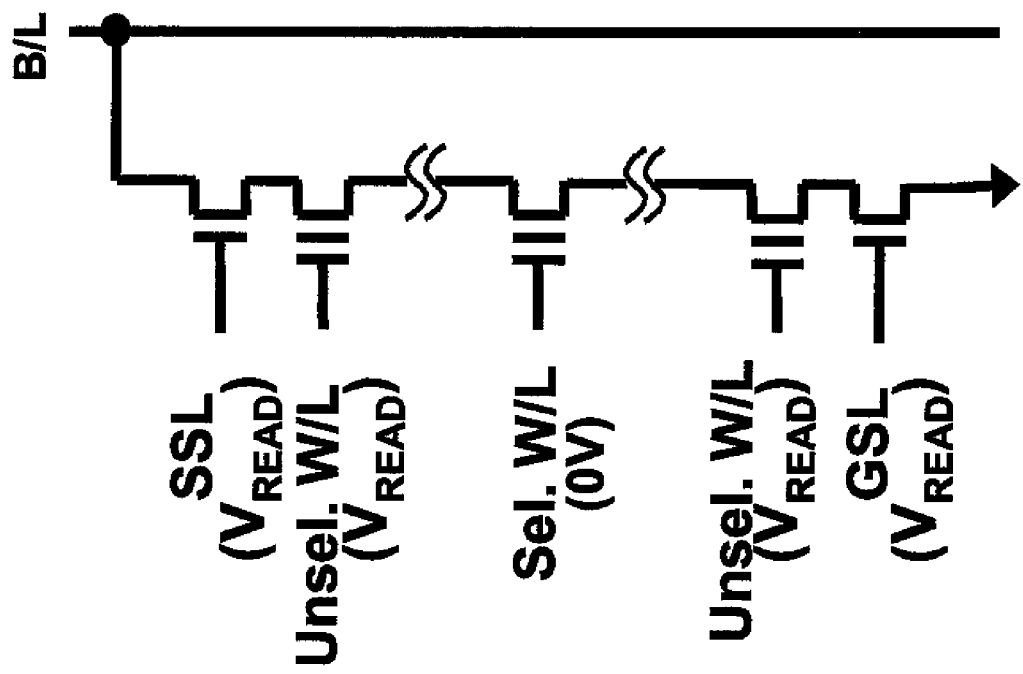
FIG. 5 is a diagram for explaining the reading of the NAND-flash memory cell block shown in FIG. 3A.
Figure 6:
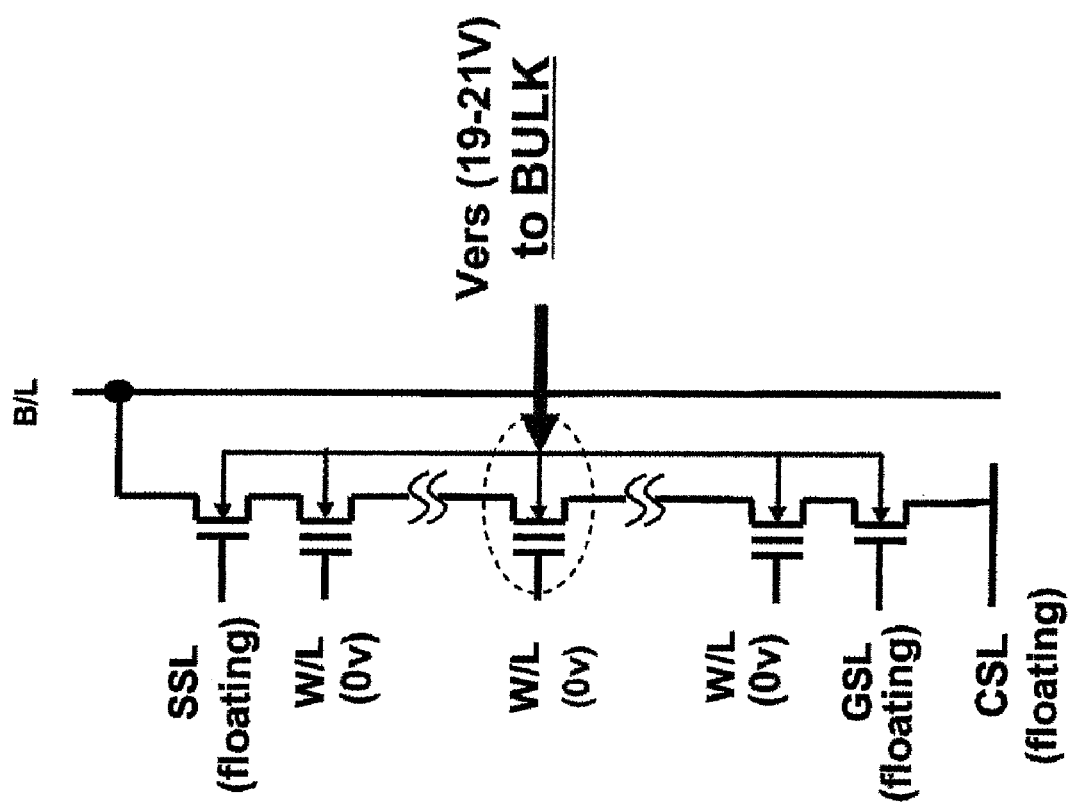
FIG. 6 is a diagram for explaining the erasing of the NAND-flash memory cell block shown in FIG. 3A.
Figure 7:
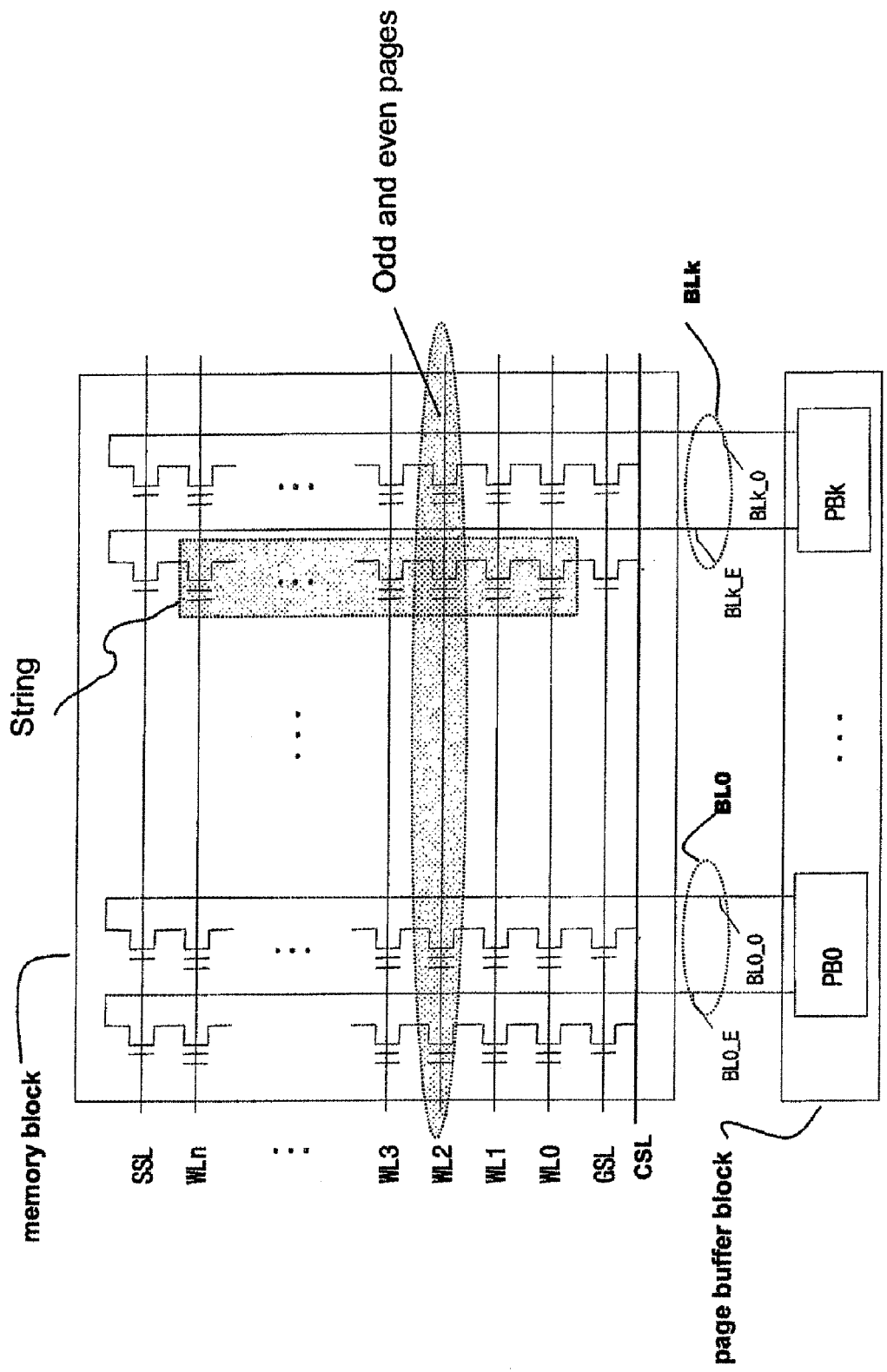
FIG. 7 is a schematic diagram of a memory block and a page buffer block.
Figure 8:
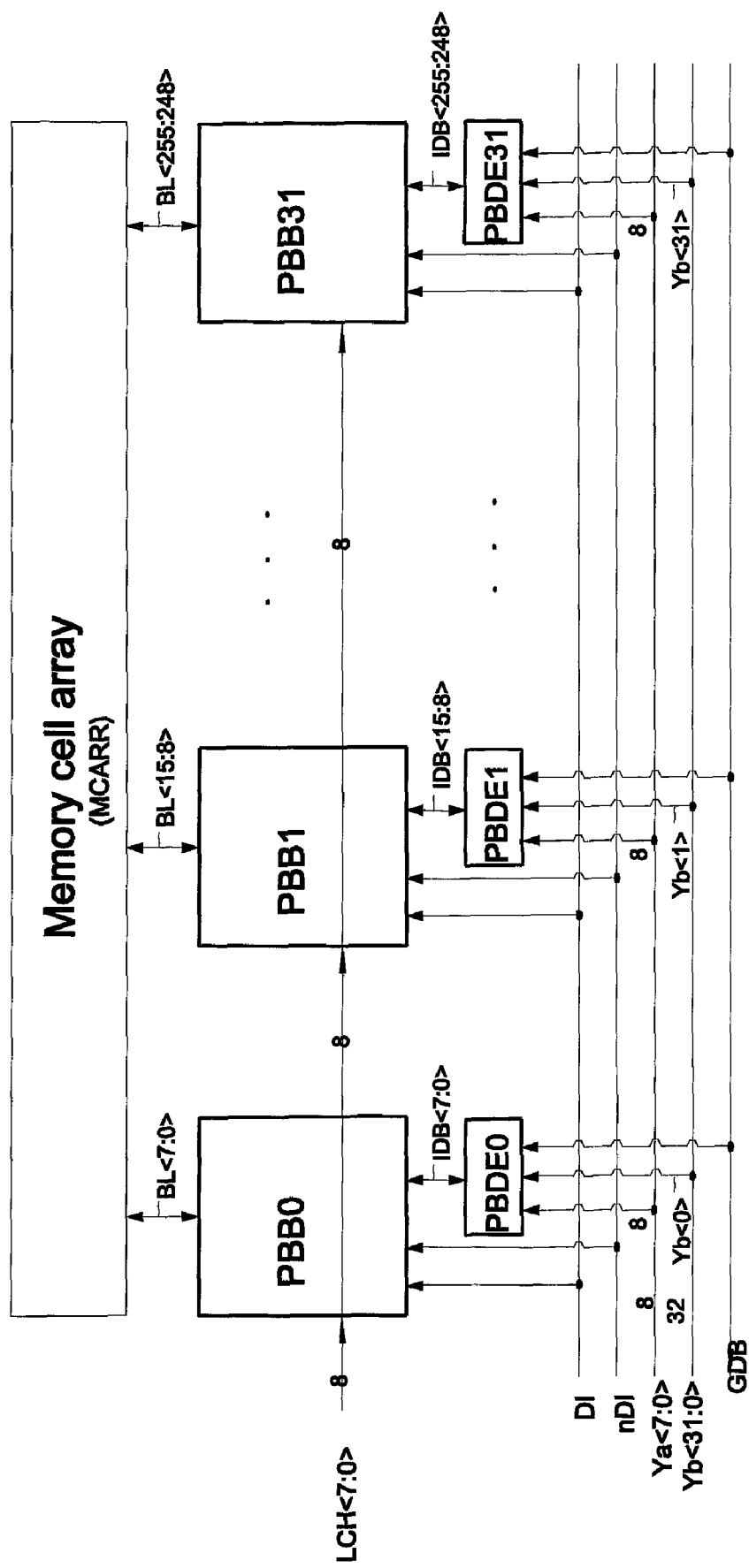
FIG. 8 is a schematic diagram of a conventional nonvolatile memory device.
Figure 9:
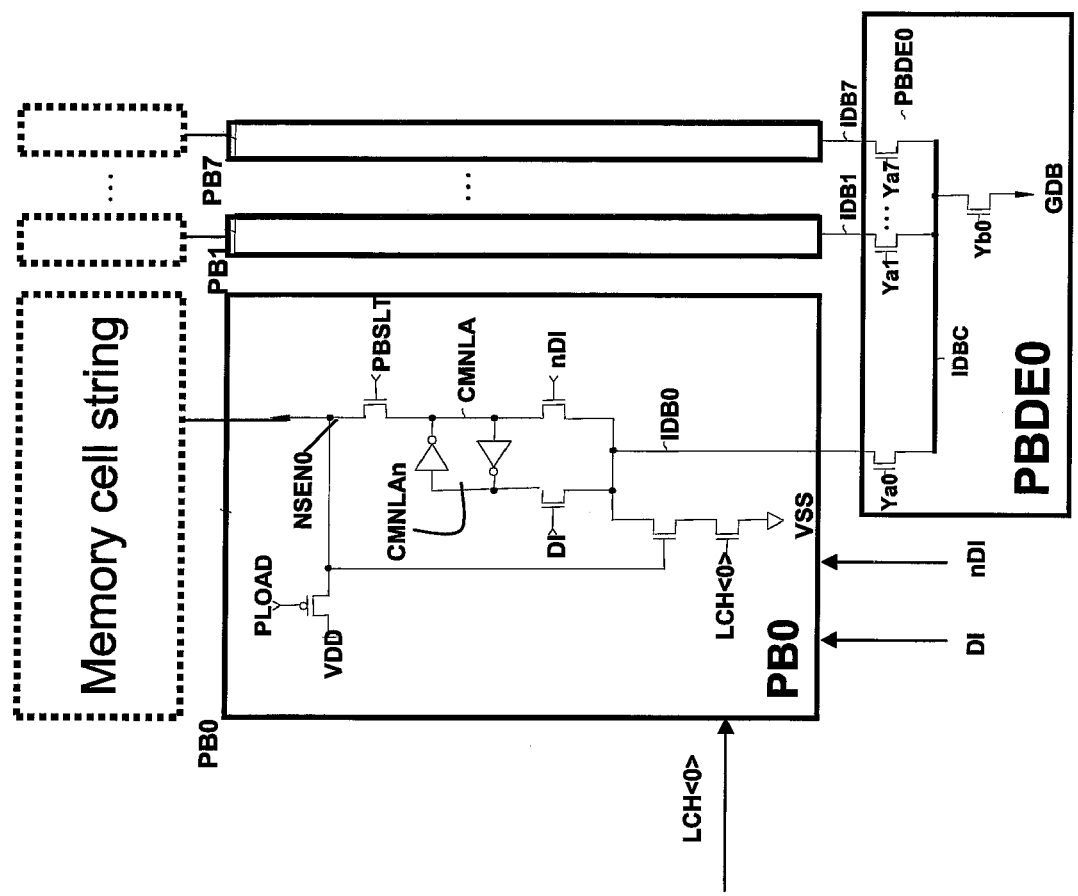
FIG. 9 is a schematic diagram of a page buffer and a page buffer decoder contained in the nonvolatile memory device of FIG. 8.

As such, in the example of the present embodiment, the total number of column address bus lines is 24, which compares quite favorably to the 40 column address lines of the conventional memory device illustrated in FIG. 8.

Also, as describe above, internal output line IDOUT0 is electrically isolated from the latch node NLAT and the buffer input paths RBIN1 and RBIN2. Thus, distortion of data stored on the latch node NLAT of a selected page buffer (e.g., NWBUF0) can be minimized which might otherwise result from data stored in other page buffers (e.g., NWBUF<7:1>) and charged on the internal output line IDOUT0.

Examples of the read, program and erase operational modes of the above-described embodiments will now be described. In each of the explanations that follow, reference should also be made to previously discussed FIGS. 11-15.

A read operational mode will be described first with reference to FIGS. 16A and 16B.

Figure 16A:
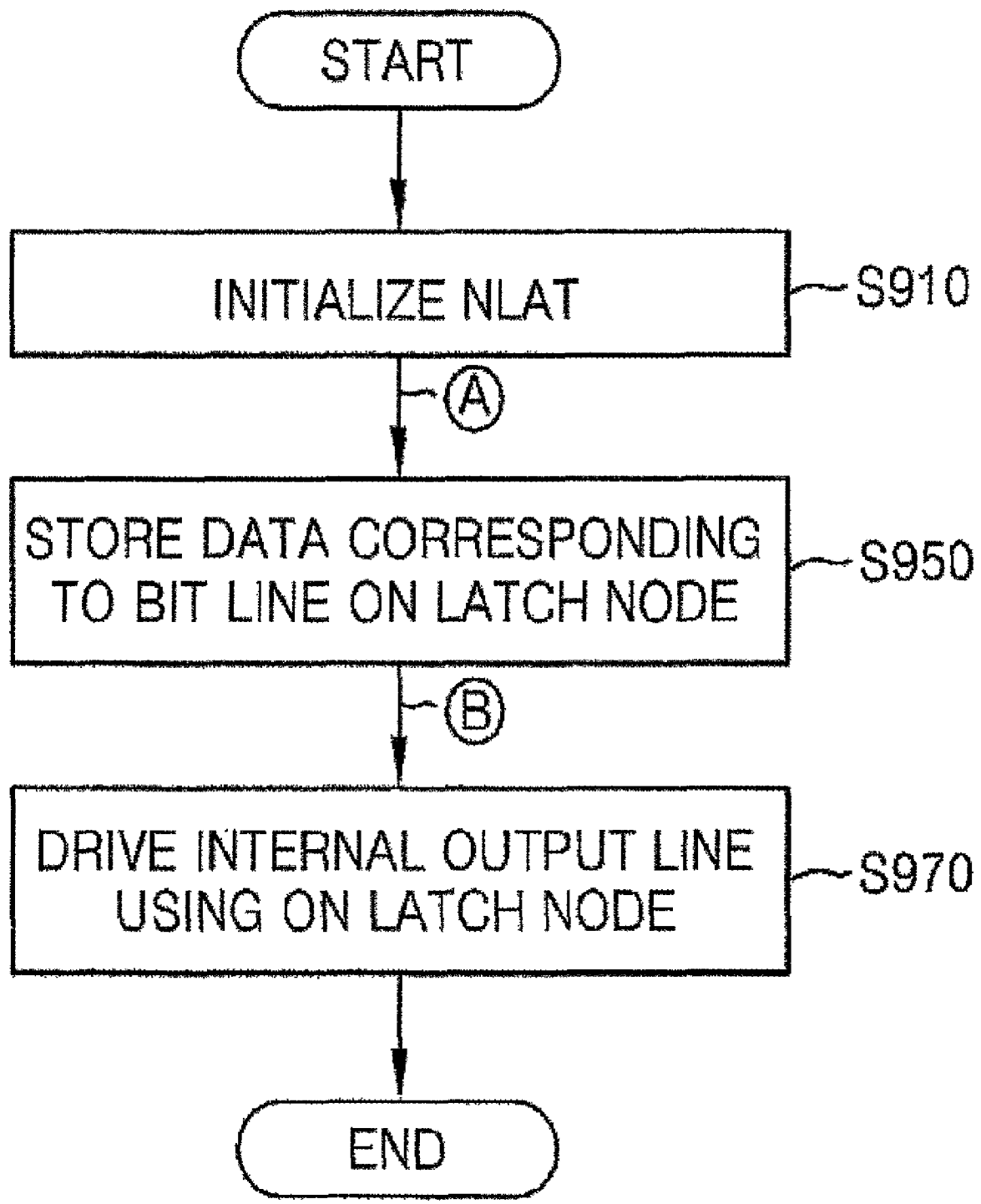
FIGS. 16A and 16B are flow charts for describing a read mode of a nonvolatile memory according to an embodiment of the present invention.

FIG. 16A is a flowchart for describing a method of operating a page buffer NWBUF to output data stored in a selected memory cell MCsel (see FIG. 12).

At step S910, the latch node NLAT is initialized to data of a logic "H" state (a "first logic state") or a logic "L" state (a "second logic state"). The initialization of the latch node NLAT may be performed by either of the first internal input line IDI0 and the second internal input line nIDI0.

In a normal read operational mode of the example of this embodiment, the latch node NLAT is initialized to data of the second logic state. For the initialization of the latch node NLAT to the second logic state, the buffer selection address Yp0 becomes a logic "H" pulse, and the second internal input line nIDI0 also becomes a logic "H" pulse. In this case, the first internal input line IDI0 maintains a logic "L" state. Then, the latch node NLAT is initialized to data of a logic "L" state, that is, the second logic state.

On the other hand, in an erase verification read operational mode of the example of this embodiment, the latch node NLAT is initialized to data of the first logic state. For initialization of the latch node NLAT to the first logic state, the buffer selection address Yp0 becomes a logic "H" pulse, and the first internal input line IDI0 also becomes a logic "H" pulse. In this case, the second internal input line nIDI0 maintains a logic "L" state. Then, the latch node NLAT is initialized to data of a logic "H" state, that is, the first logic state.

At step S950, the data developed on the bit line BL0, which corresponds to the data stored in the selected memory cell MCsel, is stored on the latch node NLAT.

Figure 16B:
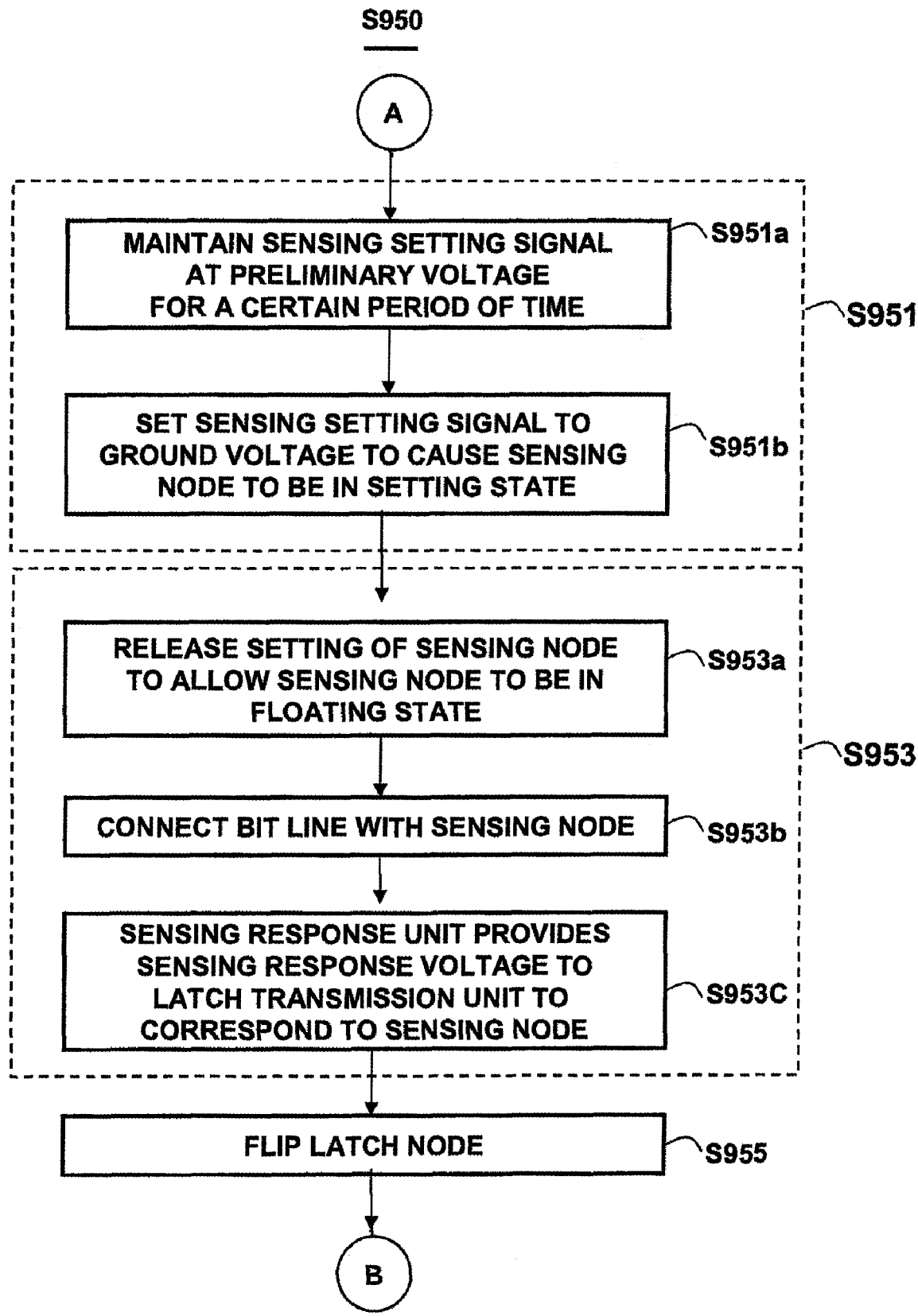

FIG. 16B is a flowchart for describing the steps S951, S953 and S955 which may be executed as the step S950 of FIG. 16A. In this example, execution of step S951a is considered preferable, but may be omitted.

At step S951, the sensing node NSEN0 is adjusted to the supply voltage VDD, that is, the setting voltage, by the sensing setting transistor 860a of the sensing setting unit 860. The setting voltage controls the sensing response unit 830 (enabled in response to the read latch signal LCH) to provide the sensing response voltage to the latch transmission unit 820. Further, the bit line shutoff signal BLSHF is changed to a logic "L" state.

In this example, Step S951 includes steps S951a and S951b. At step S951a, the voltage level of the sensing setting signal /PLOAD is maintained at a first preliminary voltage VPRE1 for a predetermined period of time, to prevent the undershooting of supply voltage VDD. At step S951b, the sensing setting signal /PLOAD is changed to a logic "L" state.

At step S953, the sensing response unit 830 provides the sensing response voltage to the latch transmission unit 820 in response to the data developed on the bit line BL0. In this example, Step S953 includes steps S953a, S953b and S953c.

At step S953a, the sensing setting signal /PLOAD becomes a logic "H" state. As such, the setting state of the sensing node NSEN0 is released, and the sensing node NSEN0 is changed to a floating state. Further, at step S953b, the bit line shutoff transistor 870a is turned on, so that the floating sensing node NSEN0 is connected to the bit line BL0. Therefore, the sensing node NSEN0 receives the data developed on the bit line BL0.

Consequently, if the selected memory cell MCsel is an OFF cell, the voltage level of the sensing node NSEN0 is maintained at about the supply voltage VDD. On the other hand, if the selected memory cell MCsel is an ON cell, the voltage level of the sensing node NSEN0 is maintained at about the ground voltage VSS.

At step S953c, the sensing response unit 830 selectively provides a sensing response voltage according to the sensing node NSEN0 to the latch transmission unit 820. That is, if the read latch signal LCH is generated as an "H" pulse when the selected memory cell MCsel is an OFF cell and the voltage level of the sensing node NSEN0 is maintained at about the supply voltage VDD, the sensing response unit 830 provides the sensing response voltage (VSS in this example) to the latch transmission unit 820. On the other hand, when the selected memory cell MCsel is an ON cell and the voltage level of the sensing node NSEN0 is maintained at about the ground voltage VSS, the sensing response voltage is not provided to the latch transmission unit 820 even though the read latch signal LCH is generated as an "H" pulse.

At step S955, the latch node NLAT is flipped in response to the sensing response voltage supplied to the latch transmission unit 820.

As discussed above in connection with step S910, in a normal read operational mode, the latch node NLAT is initialized to data of the second logic state. In this case, at step S955, the first internal input line IDI0 is in a logic "H" state and the second internal input line nIDI0 is in a logic "L" state. Therefore, when the selected memory cell MCsel is an OFF cell, that is, a programmed cell, the latch node NLAT is flipped from a logic "L" state (second logic state) to a logic "H" state (first logic state). However, when the selected memory cell MCsel is an ON cell, that is, an erased cell, the latch node NLAT maintains the logic "L" state (second logic state).

On the other hand, as also described above in connection with step S910, in the erase verification read operational mode, the latch node NLAT is initialized to data of a first logic state. In this case, the first internal input line IDI0 is in a logic "L" state and the second internal input line nIDI0 is in a logic "H" state at step S955. Therefore, if the selected memory cell MCsel is an OFF cell, that is, an unerased cell, the latch node NLAT is flipped from a logic "H" state (first logic state) to a logic "L" state (second logic state). On the other hand, if the selected memory cell MCsel is an ON cell, that is, an erased cell, the latch node NLAT maintains the logic "H" state (first logic state).

Returning to FIG. 16A, at step S970, the output driving unit 840 is controlled by the data stored on the latch node NLAT. Therefore, the internal output line IDOUT0 is selectively driven to a drive voltage, that is, the ground voltage VSS. That is, if the data stored on the latch node NLAT is logic "H", the internal output line IDOUT0 is driven to the ground voltage VSS in response to the buffer selection address Yp0. However, if the data stored on the latch node NLAT is logic "L", the internal output line IDOUT0 maintains its initial logic state, which is the supply voltage VDD, even when the buffer selection address Yp0 changes to a logic "H" state.

An example of the normal read operation mode is described below in greater detail with reference to the timing diagram of FIG. 17.

Figure 17:
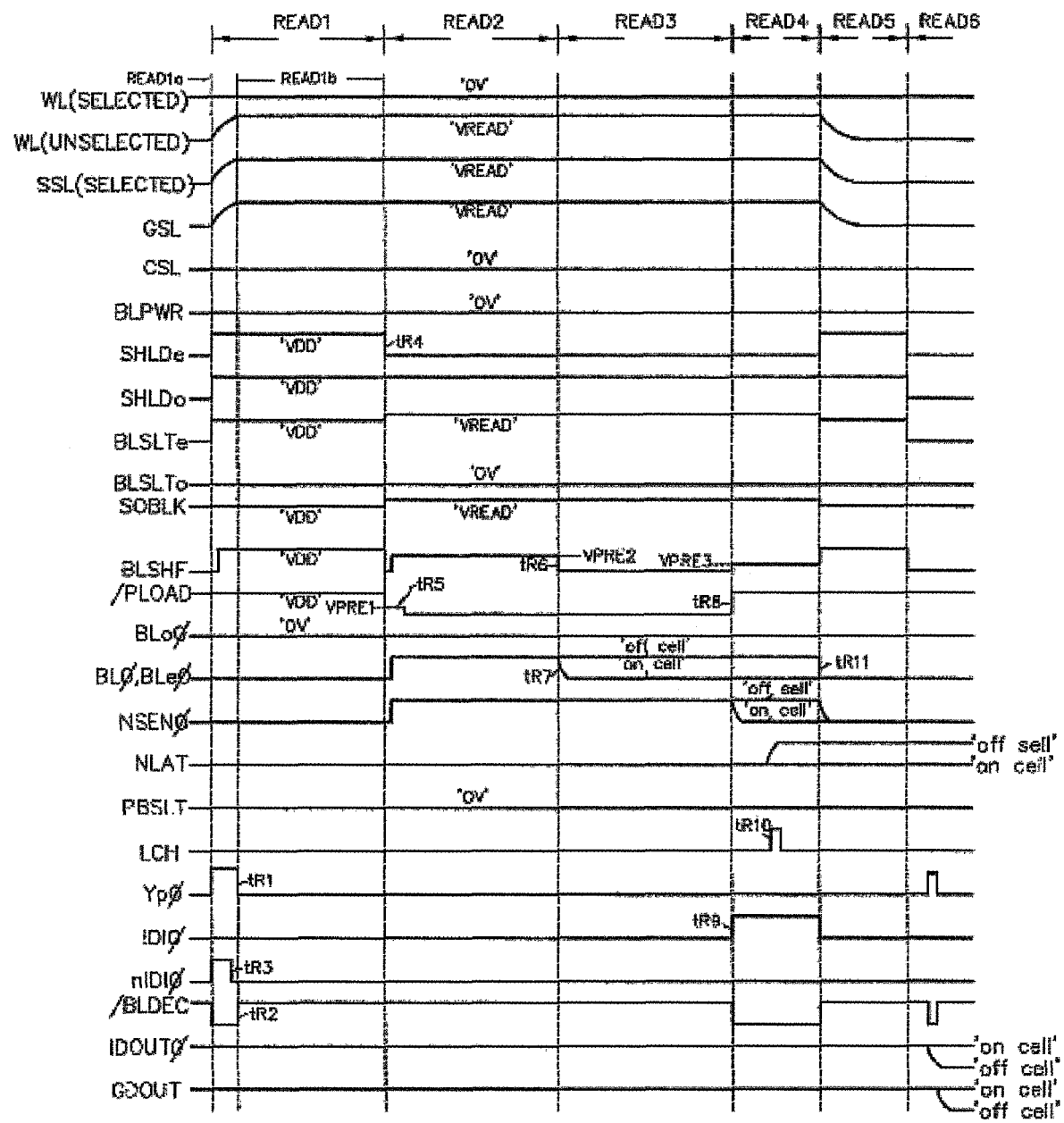
FIG. 17 is a timing diagram for describing a read mode of a nonvolatile memory according to an embodiment of the present invention.

FIG. 17 is a normal read operational mode (read mode) timing diagram showing various signal voltages and node voltages of the nonvolatile memory device illustrated in the examples of FIGS. 11 through 15. Again, reference should be made to these earlier figures in the explanation that follows.

In the read mode, data written in a selected memory cell MCsel is fetched, and the fetched data is then output.

For purposes of explanation, the read mode illustrated in FIG. 17 is divided into six intervals, namely, a bit line discharge and page buffer reset interval (hereinafter referred to as a "READ1 interval"), a bit line precharge interval (hereinafter referred to as a "READ2 interval"), a bit line develop interval (hereinafter referred to as a "READ3 interval"), a sensing interval (hereinafter referred to as a "READ4 interval"), a recovery interval (hereinafter referred to as a "READ5 interval"), and a data fetch interval (hereinafter referred to as a "READ6 interval").

Again, for purposes of explanation, the "READ1 interval" is divided into a page buffer reset interval (hereinafter referred to as a "READ1a interval") and a bit line discharge interval (hereinafter referred to as a "READ1b interval"). During the READ1a interval, the latch node NLAT of the page buffer is reset to a logic "L" state, that is, the ground voltage VSS. Subsequently, during the READ1b interval, the even bit line BLe0, the odd bit line BLo0 and the bit line BL0 are discharged to the ground voltage VSS, that is, data of a logic "L" state.

Reset of the latch node NLAT during the READ1a interval occurs as follows. During the READ1a interval, since the buffer selection address Yp0 is in a logic "H" state, the latch driving transistor 825a is turned ON (tR1). Further, since both the main selection address Yq0 and the sub-selection address Yr0 are logic "H", the block decoding signal /BLDEC is changed to a logic "L" state (tR2). In this case, the first global input line GDI is logic "H" and the second global input line nGDI is logic "L". Therefore, the first internal input line IDI0 is logic "L", and the second internal input line nIDI0 is logic "H" (tR3). Therefore, the first latch transmission transistor 820a is turned OFF, and the second latch transmission transistor 820b is turned ON. Accordingly, the node N810a of the latch unit 810 is changed to a logic "H" state, and the latch node NLAT is reset to a logic "L" state.

The discharge of the bit lines BLe0, BLo0 and the BL0 during the READ1b will now be described. For convenience, it is assumed here that the uppermost memory cell MCsel in the left memory cell string STe0 (FIG. 12) is selected.

During the READ1b interval, a read voltage VREAD (for example, 5V) is applied to unselected word lines WL<n−2:0> and the ground voltage VSS is applied to a selected word line WLn−1. Further, the read voltage VREAD is applied to both the string selection line SSL and the ground selection line GSL, and the ground voltage VSS is applied to the common source line CSL.

Further, a bit line voltage line BLPWR maintains the ground voltage VSS, and the even shielding signal SHLDe, the odd shielding signal SHLDo, the voltage levels of the even bit line selection signal BLSLTe and the sensing node blocking signal SOBLK are changed to the supply voltage VDD. Therefore, the bit lines BLe, BLe0 and BLo0 are discharged to the ground voltage VSS, that is, data of a logic "L" state.

Next, during the READ2 interval, the even bit line BLe0 and the bit line BL0 are precharged to a predetermined precharge voltage (for example, 0.8V) to sense a data value in the selected memory cell MCsel.

Further, during the READ2 interval, a first voltage is applied to the selected word line WLn−1, and a second voltage is applied to the remaining unselected word lines WL<n−2:0>. In this example, the first voltage is the ground voltage VSS, and the second voltage is the read voltage VREAD. Therefore, the ON/OFF state of the selected memory cell MCsel is controlled by the data stored therein. That is, if the data stored in the selected memory cell MCsel is logic "1", the selected memory cell MCsel is in an ON state, while if the stored data is logic "0", the selected memory cell MCsel is in an OFF state.

During the READ2 interval, the even shielding signal SHLDe is changed to a logic "L" state to turn off the NMOS transistor 511 for connecting the even bit line BLe0 to the bit line voltage line BLPWR (tR4). Therefore, the discharge of the even bit line BLe0 and the bit line BL0 is released. At this time, the odd shielding signal SHLDo is maintained at the supply voltage VDD, so that the NMOS transistor 512 maintains an ON state. Therefore, the odd bit line BLo0 is maintained at the ground voltage VSS, and functions as a shielding line between even bit lines BLe0.

Further, the voltage of the sensing setting signal /PLOAD is dropped from the supply voltage VDD to a first preliminary voltage VPRE1 for a predetermined period of time, and then drops to the ground voltage VSS (tR5). Therefore, the sensing setting transistor 860a is turned on, so that the sensing node NSEN0 is changed to the supply voltage VDD, which is the setting voltage.

According to the example of this embodiment, the preliminary voltage VPRE1 of the sensing setting signal /PLOAD is about 1.0V, which is between the ground voltage VSS and the supply voltage VDD. The sensing setting signal /PLOAD is maintained at the first preliminary voltage VPRE1 for the predetermined period of time so as to reduce power noise resulting from undershooting.

In this case, the bit line shutoff signal BLSHF is changed to a second preliminary voltage VPRE2, which is between the supply voltage VDD and the ground voltage VSS. As such, the sensing node NSEN0 and the bit line BL0 become electrically connected to each other. As described above, the bit line shutoff signal BLSHF gates the bit line shutoff transistor 870a at the second preliminary voltage VPRE2, thus allowing the bit lines BL0 and BLe0 to be pre-charged to a given level due to current provided from the sensing setting transistor 860a. Here, the given level is lower than the second preliminary voltage VPRE2 by the threshold voltage of the bit line shutoff transistor 870a.

In addition, the voltage levels of the even bit line selection signal BLSLTe and the sensing node blocking signal SOBLK are changed to the read voltage VREAD such that sufficient current flows through the bit line shutoff transistor 870a.

Next, the READ3 interval is executed in which the bit line BL0 senses data stored in the selected memory cell MCsel and develops the data.

More precisely, during the READ3 interval, the bit line shutoff signal BLSHF is the ground voltage VSS to turn OFF the bit line shutoff transistor 870a (tR6). As such, the bit line BL0 becomes electrically isolated from the sensing node NSEN0, and the bit line BL0 proceeds to develop the data.

If the selected memory cell MCsel is an ON cell, data on the bit line BL0 is discharged to the common source line CSL. Therefore, the voltage level of the bit line BL0 approximates the ground voltage VSS. On the other hand, if the selected memory cell is an OFF cell, the voltage level of the bit line BL0 remains substantially unchanged (except for variations resulting from leakage current).

The sensing setting transistor 860a maintains an ON state for most of the READ3 interval, but is turned OFF (tR8) immediately before the end of the READ3 interval. The sensing node NSEN0 thus maintains the supply voltage VDD and becomes a floating state.

Next, the READ4 interval is executed in which the data developed on the bit line BL0, that is, data corresponding to the voltage level of the bit line, is stored on the latch node NLAT of the page buffer NWBUF0.

Here, the floating state of the sensing node NSEN0 generated during the READ3 interval is initially maintained while the bit line shutoff signal BLSHF is changed to a third preliminary voltage VPRE3 to turn on the bit line shutoff transistor 870a.

According to the example of this embodiment, the third preliminary voltage VPRE3 is between the ground voltage VSS and the supply voltage VDD, and is lower than the second preliminary voltage VPRE2 by a predetermined voltage difference which corresponds to a sensing margin. The voltage level of the sensing node NSEN0 is thus determined according to the voltage level developed on the bit line BL0.

In this case, the data value on the first internal input line IDI0 changes to a logic "H" state (tR9), so that the first latch transmission transistor 820a is turned ON.

In response to the read latch signal LCH, the latch node NLAT stores data on the sensing node NSEN0 as determined by the voltage level of the bit line BL0, such data corresponding to the data stored in the selected memory cell MCsel.

That is, when the selected memory cell MCsel is an ON cell, the voltage level of the bit line BL0 and the sensing node NSEN0 is close to the ground voltage VSS. Therefore, even though the read latch signal LCH is enabled to a logic "H" state, data on the latch node NLAT maintains a logic "L" state.

On the other hand, when the selected memory cell MCsel is an OFF cell, while the voltage level of the bit line BL0 and the sensing node NSEN0 may slightly drop from the pre-charged voltage level due to the influence of leakage current, the voltage level is maintained at a logic "H" state since the bit line shutoff transistor 870a cannot be turned on due to the difference between the second and third preliminary voltages VPRE2 and VPRE3. Therefore, if the read latch signal LCH is enabled to a logic "H" state, the data on the latch node NLAT is flipped to a logic "H" state.

Next, the READ5 interval is executed in which the bit line BL0 and the sensing node NSEN0 are reset.

During the READ5 interval, the even shielding signal SHLDe is changed to the supply voltage VDD, and both the even bit line selection signal BLSLTe and the sensing node blocking signal SOBLK are changed from the read voltage VREAD to the supply voltage VDD. Therefore, the bit line BL0 and the sensing node NSEN0 are reset to the ground voltage VSS (tR11).

Further, the unselected word lines WL<n−2:0>, the string selection line SSL and the ground selection line GSL are all changed from the read voltage VREAD to the ground voltage VSS.

Next, the READ6 interval is executed in which data corresponding to the latch node NLAT (stored during the READ4 interval) is output to the global output line GDOUT through the internal output line IDOUT0.

During the READ6 interval, the buffer selection address Yp0 and the block decoding signal /BLDEC are activated in the form of respective pulse signals. As a result, data corresponding to the latch node NLAT is transmitted to the global output line GDOUT through the internal output line IDOUT0.

In the example of this embodiment, the global output line GDOUT is pre-charged to the supply voltage VDD by an output line pre-charge circuit (not shown) before the block decoding signal /BLDEC is activated.

If the selected memory cell MCsel is an ON cell, data on the latch node NLAT is logic "L", and accordingly, data transmitted on the global output line GDOUT becomes a logic "H" state. On the other hand, if the selected memory cell MCsel is an OFF cell, data on the latch node NLAT is a logic "H" state, and accordingly, data transmitted on the global output line GDOUT is discharged to a logic "L" state.

Figure 18:
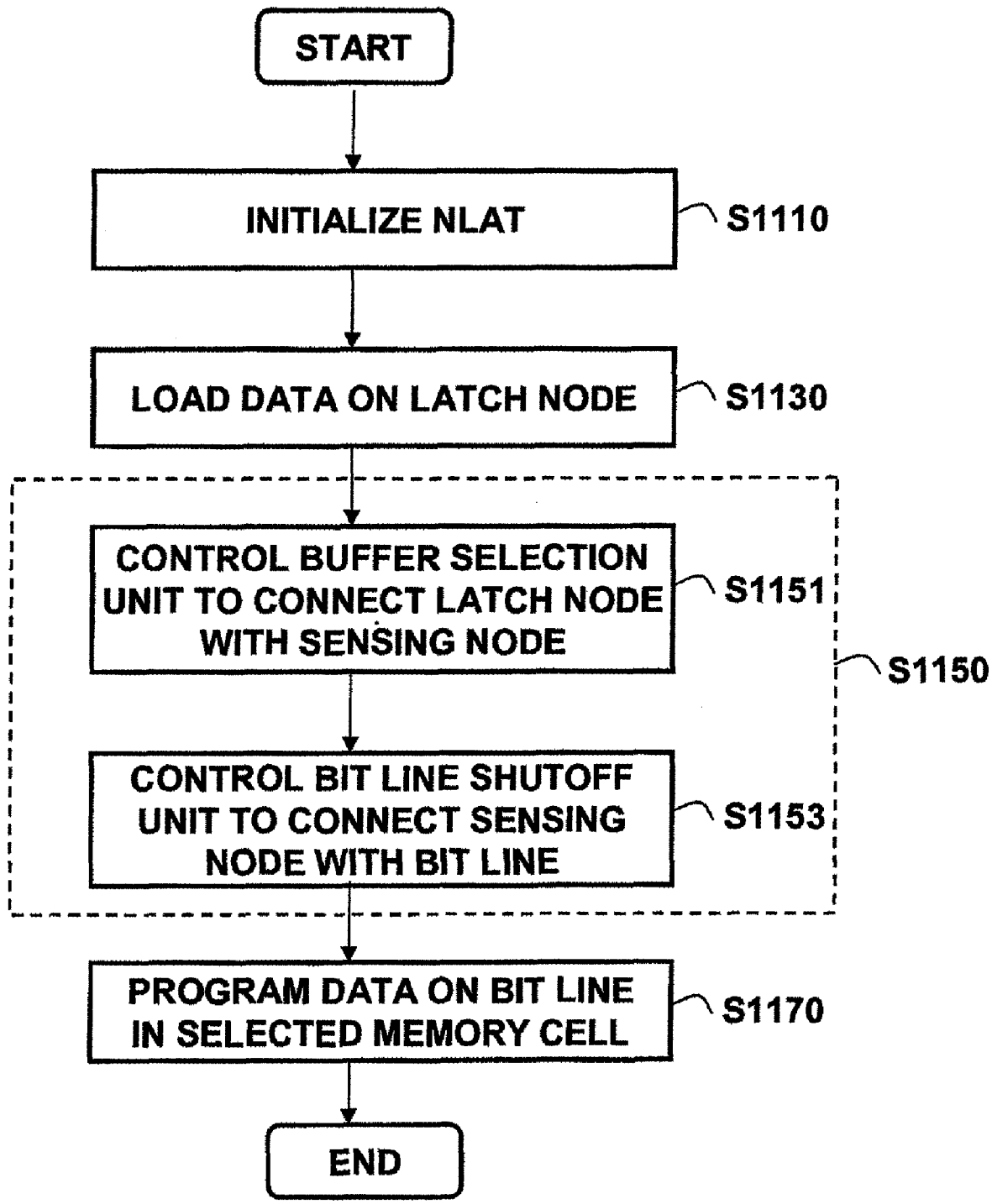
FIG. 18 is a flow chart for describing a programming mode of a nonvolatile memory according to an embodiment of the present invention.

A program operational mode (program mode) according to an embodiment of the present invention will now be described with reference to the flowchart of FIG. 18. The program mode is executed to load input data in a selected memory cell MCsel of the memory cell array.

At step S1110, the latch node NLAT is initialized. The latch node NLAT is initialized to data of a first logic state (that is, a logic "H" state) or a second logic state (that is, a logic "L" state) by either the first internal input line IDI0 or the second internal input line nIDI0. In the present example, the latch node NLAT is initialized to a program inhibited state, which is a first logic state (that is, logic "H" state), by the first internal input line IDI0.

At step S1130, the latch transmission unit 820 provides the latch driving voltage, which is the ground voltage VSS provided from the latch driving unit 825, to the latch unit 810 by either of the first and second internal input lines IDI0 and nIDI0. Further, the latch unit 810 loads data of a first logic state (that is, logic "H" state) or a second logic state (that is, logic "L" state) on the latch node NLAT using the latch driving voltage.

More specifically, if the input data is logic "H", the buffer selection address Yp0 becomes a logic "H" pulse, and the first internal input line IDI0 also becomes a logic "H" pulse. In this case, the second internal input line nIDI0 maintains a logic "L" state. Then, the latch node NLAT maintains the program inhibited state, which is a logic "H" state.

On the other hand, if the input data is logic "L", the buffer selection address Yp0 becomes a logic "H" pulse, and the second internal input line nIDI0 also becomes a logic "H" pulse. In this case, the first internal input line IDI0 maintains a logic "L" state. The latch node NLAT is then changed from a logic "H" state to a logic "L" state.

Consequently, in the example of this embodiment, when data loading is performed, the first internal input line IDI0 and the second internal input line nIDI0 have opposite logic states. If data of a logic "H" state is transmitted to the first internal input line IDI0 when the buffer selection address Yp0 is in a logic "H" state, the data of a logic "H" state is stored on the latch node NLAT of the latch unit 810. If instead data of a logic "H" state is transmitted to the second internal input line nIDI0, the data of a logic "L" state is stored on the latch node NLAT of the latch unit 810.

At step S1150, data loaded on the latch node NLAT is transmitted to the bit line BL0. This process is explained in more detail below as steps S1151 and S1153.

At step S1151, the buffer selection unit 850 is controlled to connect the latch node NLAT to the sensing node NSEN0, and ultimately, to the bit line BL0. That is, the buffer selection signal PBSLT changes to a logic "H" level so as to turn ON the buffer selection transistor 850a. The data on the latch node NLAT is then transmitted to the sensing node NSEN0.

At step S1153, the bit line shutoff unit 870 is controlled to connect the sensing node NSEN0 with the bit line BL0. More specifically, in this example, the bit line shutoff signal BLSHF changes to a logic "H" level so as to turn ON the bit line shutoff transistor 870a. The data on the sensing node NSEN0 is then transmitted to the bit line BL0.

At step S1170, the selected memory cell MCsel is programmed to correspond to the data transmitted to the bit line BL0.

An example of the program mode is described below in greater detail with reference to the timing diagram of FIG. 19.

Figure 19:
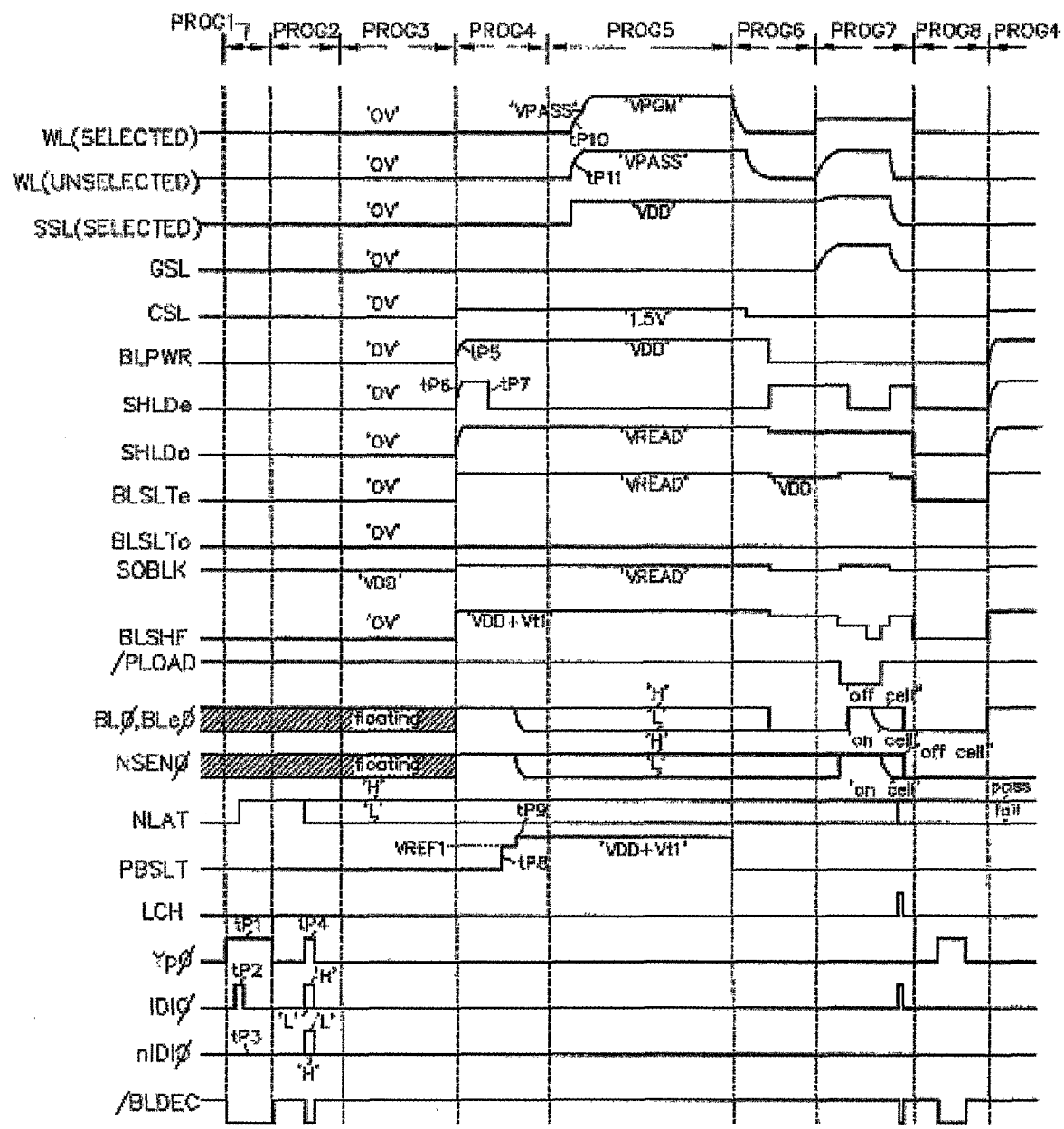
FIG. 19 is a timing diagram for describing a programming mode of a nonvolatile memory according to an embodiment of the present invention.

FIG. 19 is a program mode timing diagram showing various signal voltages and node voltages of the nonvolatile memory device illustrated in the examples of FIGS. 11 through 15. Again, reference should be made to these earlier figures in the explanation that follows.

For purposes of explanation, the timing diagram of FIG. 19 is divided into eight intervals, namely, a page buffer setup interval (hereinafter referred to as a "PROG1 interval"), a data loading interval (hereinafter referred to as a "PROG2 interval"), a high voltage enabling interval (hereinafter referred to as a "PROG3 interval"), a bit line setup interval (hereinafter referred to as a "PROG4 interval"), a program execution interval (hereinafter referred to as a "PROG5 interval"), a recovery interval (hereinafter referred to as a "PROG6 interval"), a verification read interval (hereinafter referred to as a "PROG7 interval"), and a Y-scan interval (hereinafter referred to as a "PROG8 interval").

In the PROG1 interval, the latch node NLAT is adjusted to a program inhibited state before externally applied data is loaded. In this embodiment, the program inhibited state represents a state in which the execution of cell programming is not required with respect to externally applied specific data. In this example, when data of a logic "H" state is externally applied, cell programming is not required.

In the present example, during the PROG1 interval, the buffer selection address Yp0 is in a logic "H" state (tP1) so as to turn ON the latch driving transistor 825a. Further, since both the main selection address Yq0 and the sub-selection address Yr0 are in a logic "H" state, the block decoding signal /BLDEC is activated to a logic "L" state. In this case, the first global input line GDI is an active pulse having a logic "L" state, and the second global input line nGDI is in a logic "H" state. Therefore, the first internal input line IDI0 is an active pulse having a logic "H" state (tP2), and the second internal input line nIDI0 is in a logic "L" state. The first latch transmission transistor 820a is therefore temporarily turned ON, and the second latch transmission transistor 820b is in an OFF state. In this manner, the latch node NLAT is set to the program inhibited state, i.e., a logic "H" state.

The PROG2 interval is executed next in which externally applied data is loaded on the latch node NLAT of the page buffer NWBUF0.

During the PROG2 interval, data corresponding to the externally input data is stored on the latch node NLAT in response to the first internal input line IDI0 or the second internal input line nIDI0. Further, the data stored on the latch node NLAT is provided through the buffer input paths RBIN1 and RBIN2. The logic state of the data stored on the latch node NLAT in response to the first internal input line IDI0 is opposite to the logic state of the data stored on the latch node NLAT in response to the second internal input line nIDI0. That is, in this example, the data stored on the latch node NLAT in response to the first internal input line IDI0 is logic "H", and the data stored on the latch node NLAT in response to the second internal input line nIDI0 is logic "L".

At time tP4 in the PROG2 interval, the buffer selection address Yp0 is logic "H". Since both the main selection address Yq0 and the sub-selection address Yr0 are both logic "H", the block decoding signal /BLDEC is logic "L". At this time, the first global input line GDI or the second global input line nGDI is changed to a logic "H" state.

That is, if the input data is logic "L", the second global input line nGDI is changed to a logic "L" state. More precisely, the first internal input line IDI0 is changed to a logic "L" state, and the second internal input line nIDI0 is changed to a logic "H" state. Therefore, data of a logic "L" state is stored on the latch node NLAT.

On the other hand, if the input data is logic "H", the first global input line GDI is changed to a logic "L" state. More precisely, the second internal input line nIDI0 is changed to a logic "L" state, and the first internal input line IDI0 is changed to a logic "H" state. Therefore, data of a logic "H" state is stored on the latch node NLAT.

The PROG3 interval is executed next. Here, a group of high voltage pumping circuits (not shown) included in the nonvolatile semiconductor memory device is enabled. Generally, these circuits are for generating a voltage which is greater than the supply voltage VDD. In the example of this embodiment, the high voltage pumping circuit group includes circuits for generating a program voltage (VPGM, for example, 20V), a pass voltage (VPASS, for example, 7 to 9V), a read voltage (VREAD, for example, 5V), etc. Further, the high voltage pumping circuit group may also include a circuit for generating a boosting voltage VPP (not shown) which is utilized by a row decoder (not shown). For reference, the supply voltage VDD in the example of the present embodiment is about 2.2 V.

During the PROG4 interval, the even bit line BLe0 connected to the selected memory cell MCsel, that is, a selected bit line, is adjusted to a voltage level corresponding to data stored on the latch node NLAT. Further, the odd bit line BLo0 that is not connected to the selected memory cell MCsel, that is, an unselected bit line, is adjusted to a program inhibited state.

Also during the PROG4 interval, the voltage level of the bit line voltage line BLPWR increases to the supply voltage VDD (tP5). Further, the voltage levels of the even shielding signal SHLDe and the odd shielding signal SHLDo increase to the read voltage VREAD (tP6). Therefore, without causing a voltage drop, the voltage levels of the even bit line BLe0 and the odd bit line BLo0 are changed to the supply voltage VDD, which is the voltage of the bit line voltage line BLPWR.

Further, the voltage levels of the even bit line selection signal BLSLTe and the sensing node blocking signal SOBLK also increase to the read voltage VREAD. The voltage level of the bit line shutoff signal BLSHF increases to a voltage "VDD+Vt1". In the present example, the voltage "Vt1" is a predetermined voltage of about 1.5 V.

Further, at the time tP7 of the PROG4 interval, after the lapse of a predetermined time period, the voltage level of the even shielding signal SHLDe decreases again to the ground voltage VSS. Further, after the buffer selection signal PBSLT is changed to a first reference voltage VREF1 (tP8), it is changed again to a fifth voltage (tP9). In the example of this embodiment, the fifth voltage is equal to "VDD+Vt1", and the first reference voltage VREF1 is about 1.3V, which is between the ground voltage VSS and the fifth voltage.

The data stored on the latch node NLAT is transmitted to the even bit line BLe0 connected to the selected memory cell MCsel. That is, if the data stored on the latch node NLAT is logic "L", the voltage of the even bit line BLe0 becomes "0V". Further, if the data stored on the latch node NLAT is logic "H", the even bit line BLe0 maintains the supply voltage VDD.

The PROG5 interval is executed next in which data transmitted to the even bit line BLe0 is stored in the selected memory cell MCsel.

After a pass voltage VPASS is applied to a selected word line WLn−1 for a predetermined period of time, the program voltage VPGM, which is a third voltage, is applied to the selected word line (tP10). The program voltage VPGM allows data corresponding to the voltage level of the even bit line BLe0, that is, the bit line BL0, to be programmed in the selected memory cell MCsel. Further, the pass voltage VPASS is applied to the unselected word lines WL<n−2:0> (tP11). Therefore, the unselected memory cells MC maintain their ON states without being programmed.

If data transmitted to the even bit line BLe0 is logic "H" during the PROG5 interval, the program inhibited state is maintained. On the contrary, if the data transmitted to the even bit line BLe0 is logic "L", the selected memory cell MCsel is programmed by F-N tunneling. Therefore, in this example, the memory cell MCsel in which data of a logic "L" state is stored can be designated as a "programmed cell".

Also, during the PROG5 interval, the string selection line SSL is changed to the supply voltage VDD, the ground selection line GSL is the ground voltage VSS, and the common source line CSL has a voltage of about 1.5V.

The PROG6 interval is executed next in which word lines WL<n−1:0>, bit lines BL0, BLe0 and BLo0, and the sensing node NSEN0 are discharged to the ground voltage VSS.

That is, during the PROG6 interval, the bit line voltage line BLPWR maintains the ground voltage VSS. Also, the even shielding signal SHLDe, the odd shielding signal SHLDo, the even bit line selection signal BLSLTe, the sensing node blocking signal SOBLK, and the bit line shutoff signal BLSHF are changed to the supply voltage VDD. Therefore, the word lines WL<n−1:0>, the bit lines BL0, BLe0 and BLo0, and the sensing node NSEN0, are discharged to the ground voltage VSS.

Further, the buffer selection signal PBSLT is changed to the ground voltage VSS to electrically isolate the bit line BL0 from the latch node NLAT.

The PROG7 interval is executed next to sense (verify) the data programmed in the memory cell MCsel.

The operation performed during the PROG7 interval is almost identical to that performed in the previously described read mode. However, the PROG7 interval differs from the read mode in that a predetermined verification read voltage is applied to the selected word line WLn−1 and the resetting of the page buffer NWBUF0 can be omitted. Since the remaining operations performed during the PROG7 interval are similar to those of the read mode, a detailed description thereof is omitted here to avoid redundancy.

The PROG8 interval is executed next in which a determination is made as to whether the selected memory cell MCsel has been correctly programmed using the data stored on the latch node NLAT during the PROG7 interval.

That is, during the PROG8 interval, if the data stored on the latch node NLAT is logic "H", data of a logic "L" state is output to the global output line GDOUT, so that a pass signal is generated. Further, if the data on the latch node NLAT is logic "L", data of a logic "H" state is output to the global output line GDOUT, so that a fail signal is generated.

When the fail signal is generated during the PROG8 interval, a program loop from the PROG4 interval to the PROG8 interval is repeated. Consequently, when the pass signal is generated, the program mode is completed.

An example of an erase operational mode (erase mode) is described below with reference to the timing diagram of FIG. 20.

Figure 20:
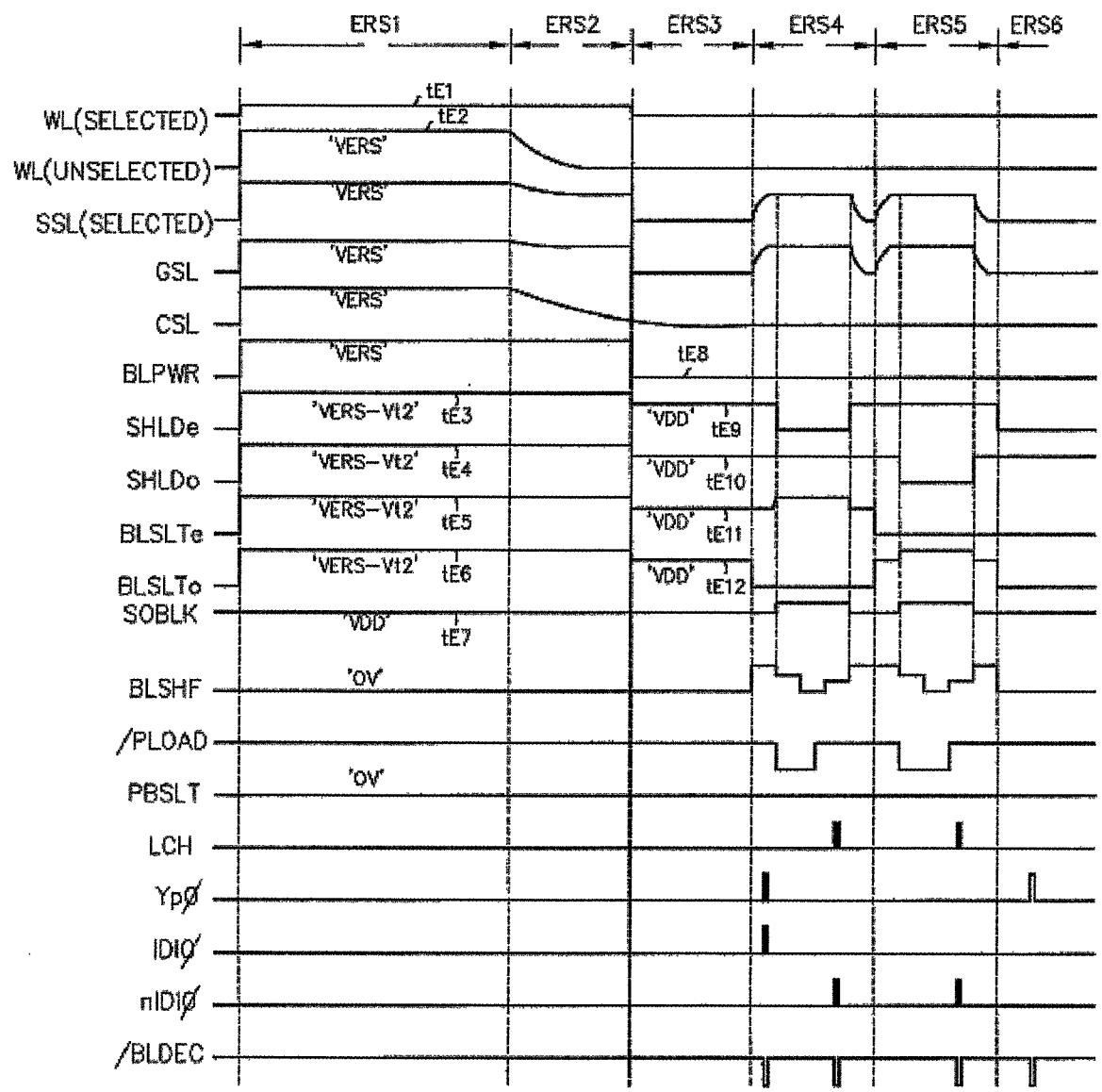
FIG. 20 is a timing diagram for describing erase mode of a nonvolatile memory according to an embodiment of the present invention

FIG. 20 is an erase mode timing diagram showing various signal voltages and node voltages of the nonvolatile memory device illustrated in the examples of FIGS. 11 through 15. As before, reference should be made to these earlier figures in the explanation that follows.

For purposes of explanation, the erase mode timing diagram of FIG. 20 is divided into six intervals, namely, an erase execution interval (hereinafter referred to as an "ERS1 interval"), a first recovery interval (hereinafter referred to as an "ERS2 interval"), a second recovery interval (hereinafter referred to as an "ERS3 interval"), a first verification read interval (hereinafter referred to as an "ERS4 interval"), a second verification read interval (hereinafter referred to as an "ERS5 interval"), and a Y-scan interval (hereinafter referred to as an "ERS6 interval").

In the ERS1 interval, an erase voltage VERS is applied to the bulk of the memory cells MC, and a sixth voltage is applied to selected word lines to erase data from corresponding memory cells. In this example, the erase voltage VERS is about 20V, and the sixth voltage is about 0.3V (tE1). Further, unselected word lines are adjusted to a floating state. The voltage of these unselected word lines is close to the erase voltage VERS due to the coupling with the bulk (tE2). Therefore, an erase operation is not performed in the memory cells connected to the unselected word lines.

Also in the ERS1 interval, the even shielding signal SHLDe, the odd shielding signal SHLDo, the even bit line selection signal BLSLTe, and the odd bit line selection signal BLSLTo, are changed to a voltage "VERS−Vt2" (tE3 to tE6), while the sensing node blocking signal SOBLK maintains the supply voltage VDD (tE7). In this case, the voltage "Vt2" represents a threshold voltage of high voltage NMOS transistors. In this example, Vt2 is about 1.3V.

The ERS2 and ERS3 intervals are executed next in which the voltages of the bulk of the memory cells MC and the bit line BL0 are controlled to sense the data stored in the selected memory cell.

That is, during the ERS2 interval, the common source line CSL is discharged. More precisely, the ERS2 interval is a period during which the bulk of the memory cell MC is floated and a voltage of "VERS−Vt" charged on the common source line CSL is discharged to the ground voltage VSS.

Further, during the ERS3 interval, the bulk and the bit lines BL0, BLe0 and BLo0 are discharged. That is, the bit line voltage line BLPWR is changed to the ground voltage VSS (tE8), and the even shielding signal SHLDe, the odd shielding signal SHLDo, the even bit line selection signal BLSLTe and the odd bit line selection signal BLSLTo are changed to the supply voltage VDD (tE9 to tE12). Therefore, the bit lines BL0, BLe0 and BLo0 are discharged to the ground voltage VSS.

The ERS4 interval and the ERS5 interval are executed next in which the latch node NLAT is set to sense any non-erased data of the memory cell MC. As such, the data in the memory cell MC is sensed and stored on the latch node NLAT.

That is, during the ERS4 interval, the data of the memory cell MC that is connected to the even bit line BLe0 and was not erased during the ERS1 interval is sensed after the latch node NLAT is set to a logic "H" state. The operation performed during the ERS4 interval is similar to that performed in the normal read mode. However, as described previously in connection with the read mode, the ERS4 interval and the normal read mode differ with respect to the value reset on the latch node NLAT. That is, in the normal read mode the latch node NLAT is reset to a logic "L" state, while the operation performed during the ERS4 interval resets the latch node NLAT to a logic "H" state.

The operation performed during the ERS4 interval further differs from the normal read mode in that the sensing of the read data is performed by activation of the second internal input line nIDI0 during the ERS4 interval. Remaining operations performed during the ERS4 interval are closely similar to those performed in the read mode, and accordingly, a detailed description thereof is omitted here to avoid redundancy.

The ERS5 interval is a period during which the data in the memory cell MC connected to the odd bit line BLo0 was not been erased during the ERS1 interval is sensed. The operation performed during the ERS5 interval differs from that performed during the ERS4 interval in that setting of the latch node NLAT is not performed. Remaining operations performed during the ERS5 interval are closely similar to those performed during the ERS4 interval, and accordingly, a detailed description thereof is omitted here to avoid redundancy.

The ERS6 interval is executed next in which a determination is made as to whether the erase operation for the memory cells MC has been correctly performed using the data sensed during the ERS4 and ERS5 intervals.

If the latch node NLAT is logic "H" during the ERS6 interval, data of a logic "L" state is output to the global output line GDOUT, so that a pass signal is generated. In contrast, if the latch node NLAT is logic "L", data of a logic "H" state is output to the global output line GDOUT, so that a fail signal is generated.

Therefore, when the pass signal is generated, the erase mode is completed.

During the ERS6 interval, the latch node NLAT maintains a logic "H" state when the memory cell is sensed as an ON cell with respect to both the ERS4 and ERS5 intervals. If the even bit line BLe0 is connected to an OFF cell (non-erased), the latch node NLAT is discharged to the ground voltage VSS during the ERS4 interval. Therefore, even if a memory cell MC connected to the odd bit line BLo0 is detected as an ON cell during the ERS5 interval, data on the latch node NLAT is logic "L".

Likewise, when the odd bit line BLo0 is connected to an OFF cell, the data on the latch node NLAT becomes logic "L" during the ERS5 interval, even though the memory cell MC connected to the even bit line BLe0 is an ON cell.

Therefore, the pass signal is generated only when both the even bit line BLe0 and the odd bit line BLo0 are sensed as being connected to an ON cells.

Although the preferred embodiments of the present invention have been disclosed for illustrative purposes, those skilled in the art will appreciate that various modifications, additions and substitutions are possible, without departing from the scope and spirit of the invention. As one example only, although a NAND-type nonvolatile semiconductor memory device is shown and described in the present specification, it will be apparent to those skilled in the art that the technical spirit of the present invention can also be applied to other types of nonvolatile semiconductor memory devices, such as AND-type semiconductor memory devices. Therefore, the technical scope of protection of the present invention must be defined by the technical spirit of the accompanying claims. In this regard, the phrase "connected to" and similar such phrases are not to be interpreted as requiring direct connection between elements.

What is claimed is:

1. A nonvolatile memory device, comprising:
   a memory cell array which includes a plurality of nonvolatile memory cells,
   a plurality of word lines, and a plurality of bit lines;
   an internal data output line which outputs data read from the memory cell array;
   a plurality of page buffers which are operatively connected between the memory cell array and the internal data output line;
   a plurality of internal data input lines connected to the page buffers, wherein the internal data input lines are electrically isolated from the internal data output line; and
   a plurality of address lines operatively connected to at least one gate circuit of the plurality of page buffers.

2. The memory device of claim 1, wherein the at least one gate circuit includes a first address gate, and wherein each of the page buffers includes a latch circuit which temporarily stores data read from the memory cell array, and an address gate connected between a first reference voltage and the internal data output line, and wherein the address line extending through each page buffer is connected to the first address gate of said each page buffer.

3. The memory device of claim 2, wherein the at least one gate circuit further includes a second address gate connected between the latch circuit and a second reference potential, wherein the address line extending through each page buffer is further connected to the second address gate of said each page buffer.

4. The memory device of claim 1, wherein the page buffers are arranged one after another to define a corresponding plurality of page buffer regions which are juxtaposed in a first direction, and wherein the plurality of address lines extend lengthwise in a second direction perpendicular to the first direction.

5. The memory device of claim 4, wherein the plurality of page buffers define a first page buffer block, and wherein the memory device further comprises a second page buffer block located adjacent the first page buffer block in the second direction, and wherein the plurality of address lines further extend across and are connected to a respective gate circuits of a second plurality of page buffers of the second page buffer block.

6. The memory device of claim 5, wherein the internal data output line extends lengthwise in the first direction.

7. The memory device of claim 6, further comprising a second internal data output line which extends lengthwise in the first direction adjacent the second page buffer block.

8. The memory device of claim 1, wherein the memory cells are flash memory cells.

9. The memory device of claim 1, wherein the memory cell array is a NAND-type flash memory cell array.

10. The memory device of claim 1, wherein the plurality of page buffers are arranged one after the other to define a plurality of juxtaposed page buffers, and wherein each of the page buffers includes a latch circuit which temporarily stores data read from the memory cell array, and an address gate connected between the latch circuit and the internal data output line, and wherein the address gate is responsive to an address signal to selectively output the data from latch circuit of each page buffer to the internal data output line.

11. The memory device of claim 10, wherein the page buffer regions are juxtaposed one after the other in a given direction, and wherein the internal data output line extends lengthwise in the given direction.

12. The memory device of claim 11, wherein the bit lines extend lengthwise in the given direction.

13. The memory device of claim 11, wherein the address signal is applied directly to the address gate of the page buffer.

14. The memory device of claim 11, wherein the memory cells are flash memory cells.

15. The memory device of claim 11, wherein the memory cell array is a NAND-type flash memory cell array.

* * * * *